US012137517B2

(12) United States Patent
Pandit et al.

(10) Patent No.: US 12,137,517 B2
(45) Date of Patent: Nov. 5, 2024

(54) SURFACE WAVE LAUNCHER FOR HIGH-SPEED DATA LINKS OVER HIGH-VOLTAGE POWER LINES WITH LOSS COMPENSATION STRUCTURE

(71) Applicant: Intel Corporation, Santa Clara, CA (US)

(72) Inventors: Vishram Shriram Pandit, Bengaluru (IN); Neel Harkishin Bhatia, Mumbai (IN); Rajiv Panigrahi, Bengaluru (IN); Ramaswamy Parthasarathy, Bengaluru (IN); Satish Ramachandra, Bengaluru (IN); Ajay Sharma, Bengaluru (IN); Manish Sharma, Bengaluru (IN); Vaibhavdeep Singh, Chandigarh (IN); Ravichandra Tungani Chikkabasavaiah, Bengaluru (IN); Jayprakash Thakur, Bengaluru (IN)

(73) Assignee: Intel Corporation, Santa Clara, CA (US)

( * ) Notice: Subject to any disclaimer, the term of this patent is extended or adjusted under 35 U.S.C. 154(b) by 508 days.

(21) Appl. No.: 17/353,866

(22) Filed: Jun. 22, 2021

(65) Prior Publication Data
US 2022/0132654 A1 Apr. 28, 2022

(30) Foreign Application Priority Data
Oct. 23, 2020 (IN) .............................. 202041046396

(51) Int. Cl.
*H05K 1/02* (2006.01)
*H01P 3/10* (2006.01)
(52) U.S. Cl.
CPC ............. *H05K 1/0237* (2013.01); *H01P 3/10* (2013.01)

(58) Field of Classification Search
CPC ............................... H05K 1/0237; H01P 3/10
See application file for complete search history.

(56) References Cited

U.S. PATENT DOCUMENTS 10,340,573 B2 * 7/2019 Johnson ............... H01Q 13/106
2004/0169572 A1 9/2004 Elmore
(Continued)

FOREIGN PATENT DOCUMENTS

CA    2325174 A1    6/2001

OTHER PUBLICATIONS

European Search Report for the corresponding EP application No. 21 19 1702, dated May 16, 2022, 5 pages (for Informational purposes only).
(Continued)

*Primary Examiner* — Raymond S Dean
(74) *Attorney, Agent, or Firm* — VIERING, JENTSCHURA & PARTNER MBB

(57) ABSTRACT

A wave launcher may include a printed circuit board (PCB) that includes a pin that receives a radio frequency (RF) signal. The wave launcher may include a cylinder configured to be electrically coupled to the pin and define an opening. The cylinder may receive the RF signal from the pin, form a transition from coplanar to Goubau line structure with a plate, and generate the surface wave. The wave launcher may include an insulator configured to be physically positioned within the opening and between the cylinder and a power line. The insulator may mechanically isolate the cylinder from the power line and permit the cylinder to launch the surface wave on the power line. The wave launcher may include the plate electrically coupled to a pad and may provide a reference for the pin and the cylinder. The pin and the cylinder may be physically positioned proximate the plate.

14 Claims, 16 Drawing Sheets

(56) References Cited

U.S. PATENT DOCUMENTS

Figure 1:
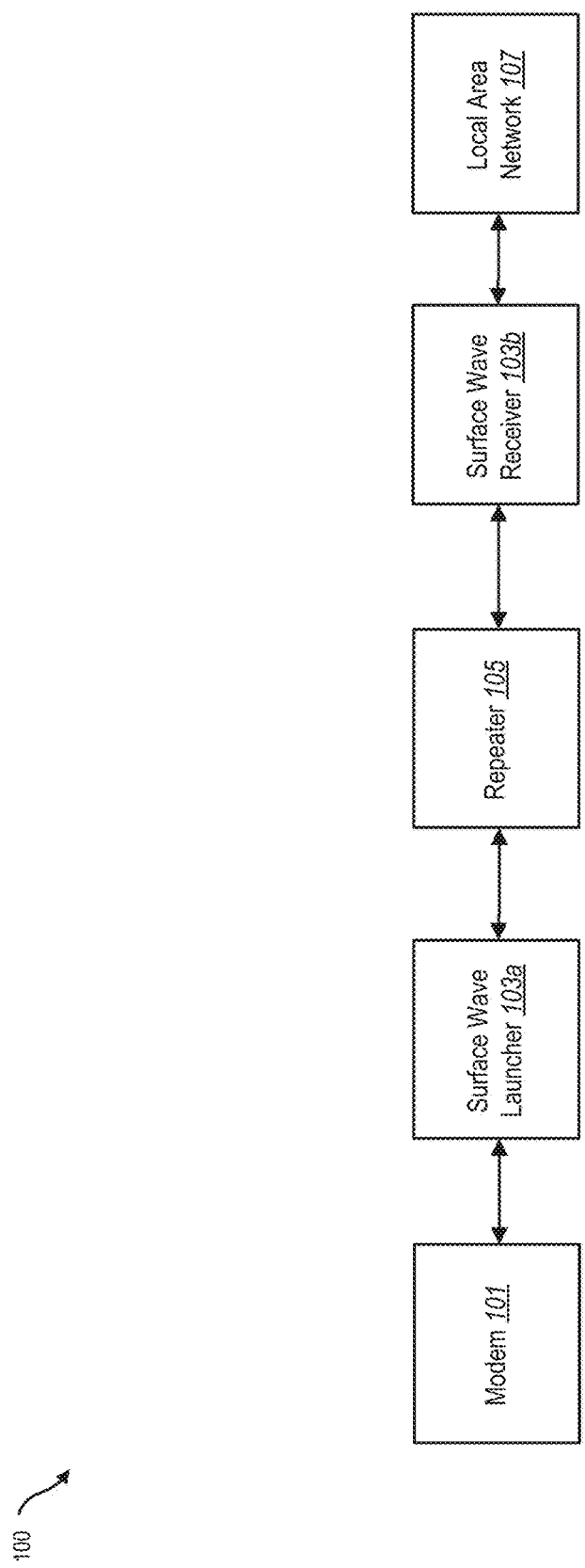

| | | | |
|---|---|---|---|
| 2018/0113161 A1 | 4/2018 | Hines et al. | |
| 2018/0139848 A1* | 5/2018 | Tateoka | B32B 27/322 |
| 2018/0191061 A1* | 7/2018 | Sundaram | H05K 3/4697 |
| 2018/0259593 A1* | 9/2018 | Corum | H01Q 1/1242 |
| 2019/0131717 A1 | 5/2019 | Vannucci et al. | |
| 2019/0296430 A1* | 9/2019 | Bennett | H01Q 1/50 |
| 2020/0287591 A1* | 9/2020 | Bowler | H04B 7/0613 |
| 2021/0167511 A1* | 6/2021 | Henry | H01Q 17/00 |

OTHER PUBLICATIONS

Sommerfeld, A., "Über die Fortpflanzung elektrodynamischer Wellen längs eines Drahtes", Annalen der Physik und Chemie, 246 pages (including 188 pages English machine translation), vol. 67, Issue 189.

Zenneck, J., "Über die Fortpflanzung ebener elektromagnetischer Wellen längs einer ebenen Leiterfläche und ihre Beziehung zur drahtlosen Telegraphie", Annalen der Physik, 1907, 53 pages (including 32 pages English machine translation), vol. 23, Series 4.

Goubau, Georg, "Surface waves and their application to transmission lines", Journal of Applied Physics, Nov. 1950, 11 pages, vol. 21.

Elmore, Glenn, "Introduction to the Propagating TM Wave on a Single Conductor", Jul. 27, 2019, 30 pages, Corridor Systems.

Alam, Nazmul et al., "Design and Application of Surface Wave Sensors for Nonintrusive Power Line Fault Detection", IEEE, Jan. 2013, pp. 339-347, IEEE Sensors Journal, vol. 13, Issue 1.

Akalin, Tahsin et al., "Single-Wire Transmission Lines at Terahertz Frequencies", IEEE, Jun. 2006, pp. 2762-2767, IEEE Transactions on Microwave Theory and Techniques, vol. 54, Issue 6.

Sharma, Apoorva et al., "Long-Range Battery-Free UHF RFID With a Single Wire Transmission Line", IEEE, Jul. 2017, pp. 5687-5693, IEEE Sensors Journal, vol. 17, Issue 17.

Alam, M. N., "Novel surface wave exciters for power line fault detection and communications", IEEE, Jul. 3-8, 2011, pp. 1139-1142, 2011 IEEE International Symposium on Antennas and Propagation (APSURSI), Spokane, WA, USA.

Sharma, Apoorva et al., "A Coplanar Vivaldi-Style Launcher for Goubau Single-Wire Transmission Lines", IEEE, published Sep. 21, 2017, pp. 2955-2958, IEEE Antennas and Wireless Propagation Letters.

Partial European Search Report issued for the corresponding European patent application No. 21191702.6, dated Feb. 4, 2022, 15 pages (for informational purposes only).

* cited by examiner

FIG. 12
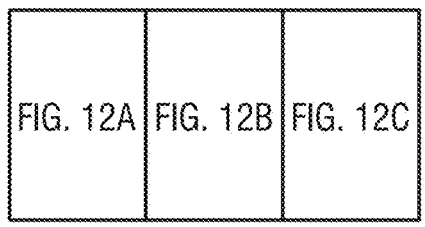
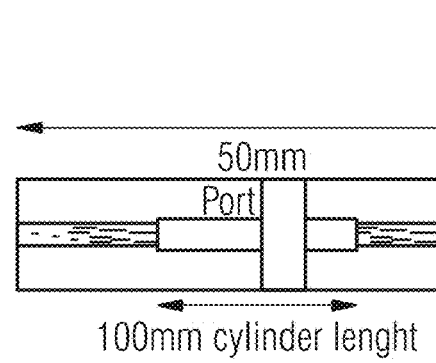
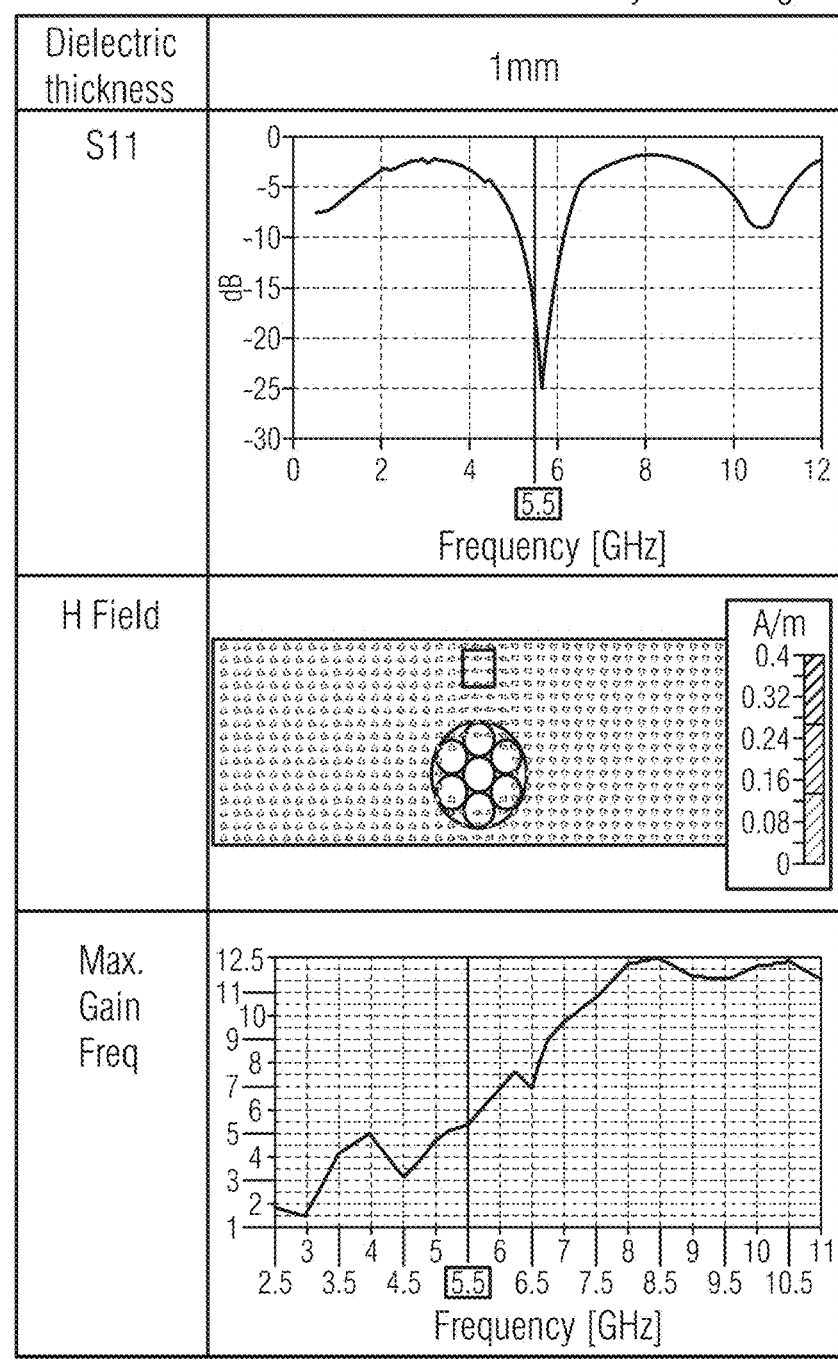
FIG. 12A

SURFACE WAVE LAUNCHER FOR HIGH-SPEED DATA LINKS OVER HIGH-VOLTAGE POWER LINES WITH LOSS COMPENSATION STRUCTURE

CROSS-REFERENCE TO RELATED APPLICATIONS

This patent application claims the benefit of and priority to India Provisional App. No. 202041046396 filed Oct. 23, 2020 titled "SURFACE WAVE LAUNCHER FOR HIGH-SPEED DATA LINKS OVER HIGH-VOLTAGE POWER LINES WITH LOSS COMPENSATION", which is incorporated in the present disclosure by reference in their entirety.

FIELD

The aspects discussed in the present disclosure are related to surface wave launcher for high-speed data links over high-voltage power lines with loss compensation structure.

BACKGROUND

Unless otherwise indicated in the present disclosure, the materials described in the present disclosure are not prior art to the claims in the present application and are not admitted to be prior art by inclusion in this section.

Broadband connectivity (e.g., signals within a Wi-Fi frequency band, a Wi-Fi extended frequency band, a cellular frequency band, fifth generation (5G) frequency band, or similar frequency bands) may be provided to some areas using surface wave launchers and current infrastructures. The surface wave launchers may launch a surface wave on power lines. In addition, surface wave launchers may receive the surface wave from the power line. The surface wave launcher may convert the surface wave to a radio frequency (RF) signal and may provide the RF signal to a local area network (LAN).

The subject matter claimed in the present disclosure is not limited to aspects that solve any disadvantages or that operate only in environments such as those described above. Rather, this background is only provided to illustrate one example technology area where some aspects described in the present disclosure may be practiced.

BRIEF DESCRIPTION OF THE DRAWINGS

Exemplary aspects will be described and explained with additional specificity and detail through the use of the accompanying drawings in which:

FIG. 1 illustrates a block diagram of an exemplary operational environment to provide broadband connectivity over power lines;

FIG. 2 illustrates an exemplary surface wave launcher that may be implemented in the environment of FIG. 1;

FIGS. 3A and 3B illustrate an exemplary method of assembling the surface wave launcher of FIG. 2;

FIG. 4 illustrates an exemplary surface wave launcher that may be implemented in the environment of FIG. 1;

FIG. 5 illustrates a block diagram of an exemplary operational environment to provide data links over power lines;

FIG. 6 illustrates an exemplary loss compensation device that may be implemented in the environment of FIG. 5;

FIG. 7 illustrate exemplary physical changes in the power lines that may occur in the environment of FIG. 5;

FIG. 8 illustrates a graphical representation of a simulation of return loss for the surface wave launcher of FIG. 2;

FIG. 9 illustrates graphical representations of simulations of H fields of the surface wave launcher of FIG. 2 at various frequencies;

FIG. 10 illustrates a graphical representation of a simulation of surface currents for the surface wave launcher and the power line of FIG. 2;

FIG. 11 illustrates graphical representations of simulations of radiation patterns of the surface wave launcher of FIG. 2 at various frequencies;

FIGS. 12A-12C illustrate a graphical representation of simulations of return loss, H Field, and max gain vs. frequency of the surface wave launcher of FIG. 2 with various thicknesses of the insulator;

FIG. 13 illustrates a graphical representation of a simulation of surface currents for the surface wave launcher and the power lines, all according to at least one aspect described in the present disclosure.

DETAILED DESCRIPTION

The following detailed description refers to the accompanying drawings that show, by way of illustration, exemplary details in which aspects of the present disclosure may be practiced.

The word "exemplary" is used herein to mean "serving as an example, instance, or illustration". Any aspect or design described herein as "exemplary" is not necessarily to be construed as preferred or advantageous over other aspects or designs.

Throughout the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. For instance, the phrase "a plurality" may be understood to include a numerical quantity greater than or equal to two (e.g., two, three, four, five, [ . . . ], etc.).

The phrases "group (of)", "set (of)", "collection (of)", "series (of)", "sequence (of)", "grouping (of)", etc., in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art.

The terms "processor" or "controller" as, for example, used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

As used herein, "memory" is understood as a computer-readable medium (e.g., a non-transitory computer-readable medium) in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, 3D XPoint™, among others, or any combination thereof. Registers, shift registers, processor registers, data buffers, among others, are also embraced herein by the term memory. The term "software" refers to any type of executable instruction, including firmware.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

Providing broadband connectivity (e.g., signals within Wi-Fi or similar frequency bands) to areas that currently do not include broadband connectivity may be difficult or cost prohibitive due to technical feasibility, current infrastructure barriers, or some combination thereof. For example, in some areas, a lack of infrastructure (e.g., lack of line of sight antennas, fiber optic cables, coaxial cables, etc.) may be prohibitive for providing broadband connectivity to those areas.

Installing new infrastructure may include high costs, complexity, and time delays for providing broadband connectivity. Wired networks (e.g., fiber optic cables, broadband cables, coaxial cables, etc.) may consume space to dig and place the cables. In addition, installing cables in an overhead configuration may be risk prohibitive due to a likelihood of theft of the cables. Coverage of wireless networks in some areas may be limited due to line of sight operation and cost of antennas. Some power line communication technologies may be limited due to low data rates.

Surface wave launchers configured to launch surface waves on power lines may provide an option for providing broadband connectivity in these areas using existing infrastructure (e.g., power poles and power lines). The surface wave launchers may generate the surface waves by converting radio frequency (RF) signals with a transverse electromagnetic (TEM) mode to surface waves with a transverse magnetic (TM) mode.

A surface wave launcher may provide broadband connectivity with increased data rates over power lines compared to other power line communication technologies. In addition, a loss compensation device may be implemented to compensate for bends, breaks, forks, or other physical changes in the power lines. The surface wave launcher may operate within an RF frequency while including stable electromagnetic fields (H fields). In addition, the surface wave launcher may include a simple snap-on like installation for attaching the surface wave launcher to the power lines. In addition, the surface wave launcher may not interfere with power signals traversing the power lines and vice versa.

The surface wave launcher may include a printed circuit board (PCB) that includes a conductor pin and ground pads. In addition, the surface wave launcher may include a cylinder electrically coupled to the conductor pin. The cylinder may define a cylinder opening. When the surface wave launcher is installed, the power line may extend through the cylinder opening. In addition, an insulator (e.g., an insulating material) may be configured to be physically positioned within at least a portion of the cylinder opening between the power line and the cylinder. The insulator may mechanically isolate the cylinder from the power line. In addition, the insulator may electrically isolate the cylinder from power signals traversing the power line. The surface wave launcher may also include a ground plate structure (e.g., one or more ground plates) that are electrically coupled to the ground pads on the PCB. The ground plates may provide a ground reference for the conductor pin, the cylinder, or some combination thereof. The conductor pin and the cylinder may be physically positioned proximate the two or more ground plates.

The PCB may include a connector (e.g., a subminiature version A (SMA) connector) that is electrically coupled to the conductor pin. The conductor pin may receive the RF signal with the TEM mode. The surface wave launcher may convert the RF signal to the surface wave with the TM mode. The cylinder and the ground plates may form a transition from a coplanar structure to Goubau line structure. The surface wave may propagate the cylinder as it transitions to a Goubau line at the end of ground plates. In addition, the cylinder may launch the surface wave to the power line via electromagnetic coupling.

The surface wave launcher may include a support structure and clamps to simply and quickly install the surface wave launcher on the power lines. In addition, the loss compensation device may be physically positioned proximate a physical change in the power line and configured to compensate for loss due to the physical change of the power line.

Surface wave launchers described in the present disclosure may permit TEM mode to TM01 mode conversion. In addition, the surface wave launchers may provide a magnetic field pattern that is stable over broadband frequencies. Further, the surface wave launchers may prevent or reduce radiation at a line of sight (e.g., the surface wave launchers may prevent or reduce radiation of wireless signals within the broadband frequencies at the direction of propagation).

In addition, the surface wave launchers may prevent mechanical coupling (direct connection) between the cylinder and the power line. The mechanical isolation of the cylinder may prevent power signals that traverse the power line from causing interference of the surface wave on the cylinder. The mechanical isolation provided by the insulator may also protect the RF equipment/modem that is mechanically coupled or electrically coupled to the surface wave launcher. Further, the surface wave launchers may install quickly and without disconnecting the power line from the power poles. The surface wave launchers may be implemented as a transmitter (e.g., a launcher) or as a receiver. The surface wave launchers may be referred to in the present disclosure as a "surface wave receiver" or a "surface wave launcher," which may be used for both transmit and receive.

These and other aspects of the present disclosure will be explained with reference to the accompanying figures. It is to be understood that the figures are diagrammatic and schematic representations of such example aspects, and are not limiting, nor are they necessarily drawn to scale. In the figures, features with like numbers indicate like structure and function unless described otherwise.

FIG. 1 illustrates a block diagram of an exemplary operational environment 100 to provide broadband connectivity over power lines, in accordance with at least one aspect described in the present disclosure. The environment 100 may include a modem 101, a surface wave launcher 103a, a repeater 105, a surface wave receiver 103b, and a LAN 107.

The modem 101 may generate a RF signal that includes data that is to be transmitted to the LAN 107. The surface wave launcher 103a may receive the RF signal. The RF signal may include a TEM mode. The surface wave launcher 103a may convert the RF signal to a surface wave with a TM mode. The surface wave launcher 103a may launch the surface wave representative of the RF signal on a power line that is between the surface wave launcher 103a and the repeater 105.

The repeater 105 may be configured to compensate for loss that occurs in the environment 100. For example, the power line may include loss (due to a bend, a break or a fork in the power line) or loss may occur due to converting the RF signal to the surface wave. The repeater 105 may include three components (not illustrated in FIG. 1). The repeater 105 may include a] a surface wave receiver, b] an amplifier, and c] a surface wave launcher. The repeater 105 including the various components is discussed in more detail below in relation to FIG. 6. The repeater 105 may receive the surface wave with the TM mode using the surface wave receiver within the repeater 105. The repeater 105 may convert the surface wave to another RF signal with the TEM mode. In addition, the repeater 105 may amplify the RF signal to compensate for the loss.

The repeater 105 may provide the amplified RF signal with the TEM mode to the surface wave launcher within the repeater 105. The surface wave launcher within the repeater 105 may receive the amplified RF signal with the TEM mode. The surface wave launcher within the repeater 105 may convert the amplified RF signal to another surface wave with the TM mode. The surface wave launcher within the repeater 105 may launch the surface wave representative of the amplified RF signal on the power line that is between the surface wave receiver within the repeater 105 and the surface wave receiver 103b.

The LAN 107 may provide broadband connectivity (e.g., access to the Internet) to electronic devices (not illustrated in FIG. 1). For example, the surface wave receiver 103b may convert the surface wave to a wireless signal to permit the electronic devices to receive data within the surface wave.

The repeater 105 may be omitted and the surface wave launcher 103a and the surface wave receiver 103b may provide the wireless signal directly to the LAN 107. It is to be noted that the surface wave launcher 103a and the surface wave receiver 103b may be reciprocal and may include the same structure as each other.

Figure 2:
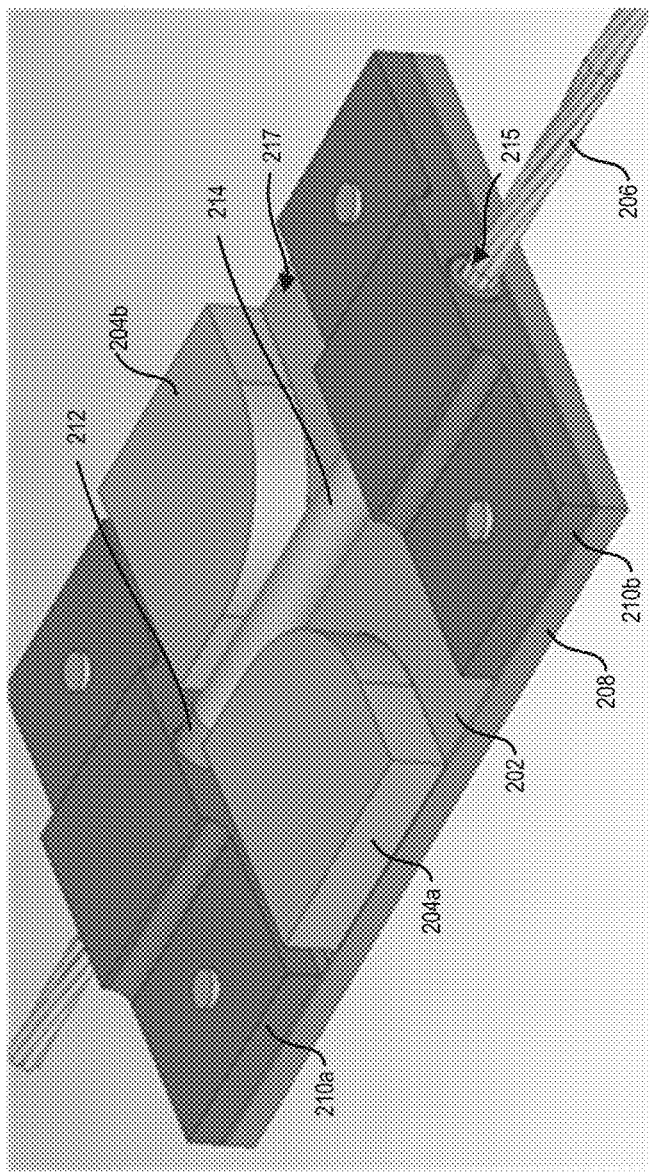

FIG. 2 illustrates an exemplary surface wave launcher 103 that may be implemented in the environment 100 of FIG. 1, in accordance with at least one aspect described in the present disclosure. The surface wave launcher 103 is illustrated in FIG. 2 as being in an assembled state. The discussion related to FIG. 2, is directed to when the surface wave launcher 103 is in the assembled state. The surface wave launcher 103 may include a PCB 202, a cylinder 214, an insulator 212, a first ground plate 204a, a second ground plate 204b, a support structure 208, a first clamp 210a, a second clamp 210b, or some combination thereof. The surface wave launcher 103 may operate within the Wi-Fi frequency band, the cellular frequency band, the 5G frequency band, or other frequency bands. The first ground plate 204a and the second ground plate 204b may form a ground plate structure.

As illustrated in FIG. 2, the power line 206 may extend through the cylinder 214 and the insulator 212 from left to right (e.g., power signals and surface waves may traverse the power line from left to right). The PCB 202 may include a conductor pin (illustrated in FIG. 3A) and one or more ground pads (also illustrated in FIG. 3A). The cylinder 214 may be electrically coupled to the conductor pin. In addition, the cylinder 214 may define a cylinder opening 215. The power line 206 may extend through the cylinder opening 215.

The insulator 212 may be physically positioned between the power line 206 and the cylinder 214. In addition, at least a portion of the insulator 212 may be physically positioned within at least a portion of the cylinder opening 215. Further, the insulator 212 may be physically positioned between the power line 206 and the cylinder 214. The insulator 212 may mechanically isolate the cylinder 214 from the power line 206. In addition, the insulator 212 may permit the cylinder 214 to launch surface waves on the power line 206. Further, the insulator 212 may electrically isolate the cylinder 214 from power signals that traverse the power line 206. The insulator 212 may extended beyond the cylinder 214 to avoid possible arcing.

The ground plates 204a-b may be electrically coupled to the one or more ground pads on the PCB. In addition, the ground plates 204a-b may provide a ground reference for the conductor pin, the cylinder 214, or some combination thereof. In addition, the ground plates 204a-b may provide the ground reference for the conductor pin and the cylinder 214 without a ground wire electrically coupled between the surface wave launcher 103 and an external device (not illustrated in FIG. 2). The ground plates 204a-b may form a three-dimensional ground structure for the surface wave launcher 103.

The ground plates 204a-b may be physically shaped and positioned as flared ground plates that flare in a direction away from the cylinder 214. The ground plates 204a-b may flare in the direction away from the cylinder 214 on a plane that is substantially parallel to a surface 217 of the PCB 220. The first ground plate 204a may be physically positioned proximate the cylinder 214 on a first side of the cylinder 214. The second ground 204b may be physically positioned proximate the cylinder 214 on a second side of the cylinder 214. The second side of the cylinder 214 may be opposite the first side of the cylinder 214. The conductor pin (from the SMA connector) may be physically positioned proximate the cylinder 214 on a third side of the cylinder 214. The third side of the cylinder 214 may be on a plane that is orthogonal to a plane of the ground plates 204a-b. The third side of the cylinder 214 may be on a plane that is not parallel to a plane of the ground plates 204a-b.

The support structure 208 may be mechanically coupled to at least a portion of the PCB 202. In addition, the clamps 210a-b may attach to the support structure 208 to secure the cylinder 214, the insulator 212, the power line 206, or some combination in the positions as illustrated in FIG. 2.

The insulator 212 may surround the entire or a portion of the power line 206. The cylinder 214 may be physically positioned on a portion of an external surface of the insulator 212. The cylinder 214 may include a conductive material. The ground plates 204a-b may be physically positioned on both sides of the cylinder 214. The PCB 202 may be physically positioned proximate the bottom of the power line 206. The PCB 202 may include a rectangular shape. The support structure 208 may be physically positioned proximate the PCB 202. The support structure 208 and/or the clamps 210a-b may include a wooden/non-conductive material. The support structure 208 may provide support to the PCB 202. The support structure 208 and the clamps 210a-b may include a material that is treated to withstand an outdoor environment (such as rainy condition).

Figure 3A:
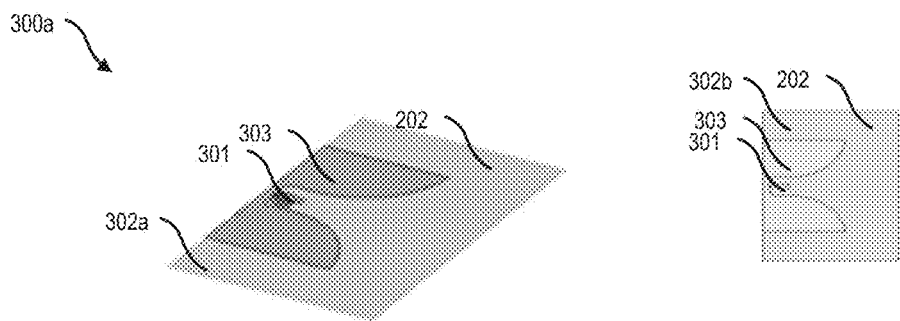
Figure 3A:
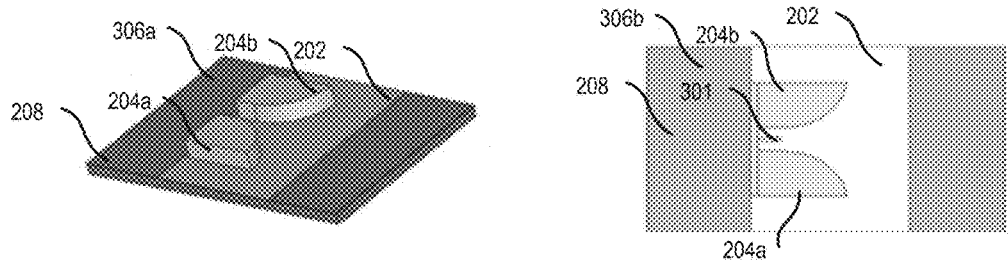
Figure 3B:
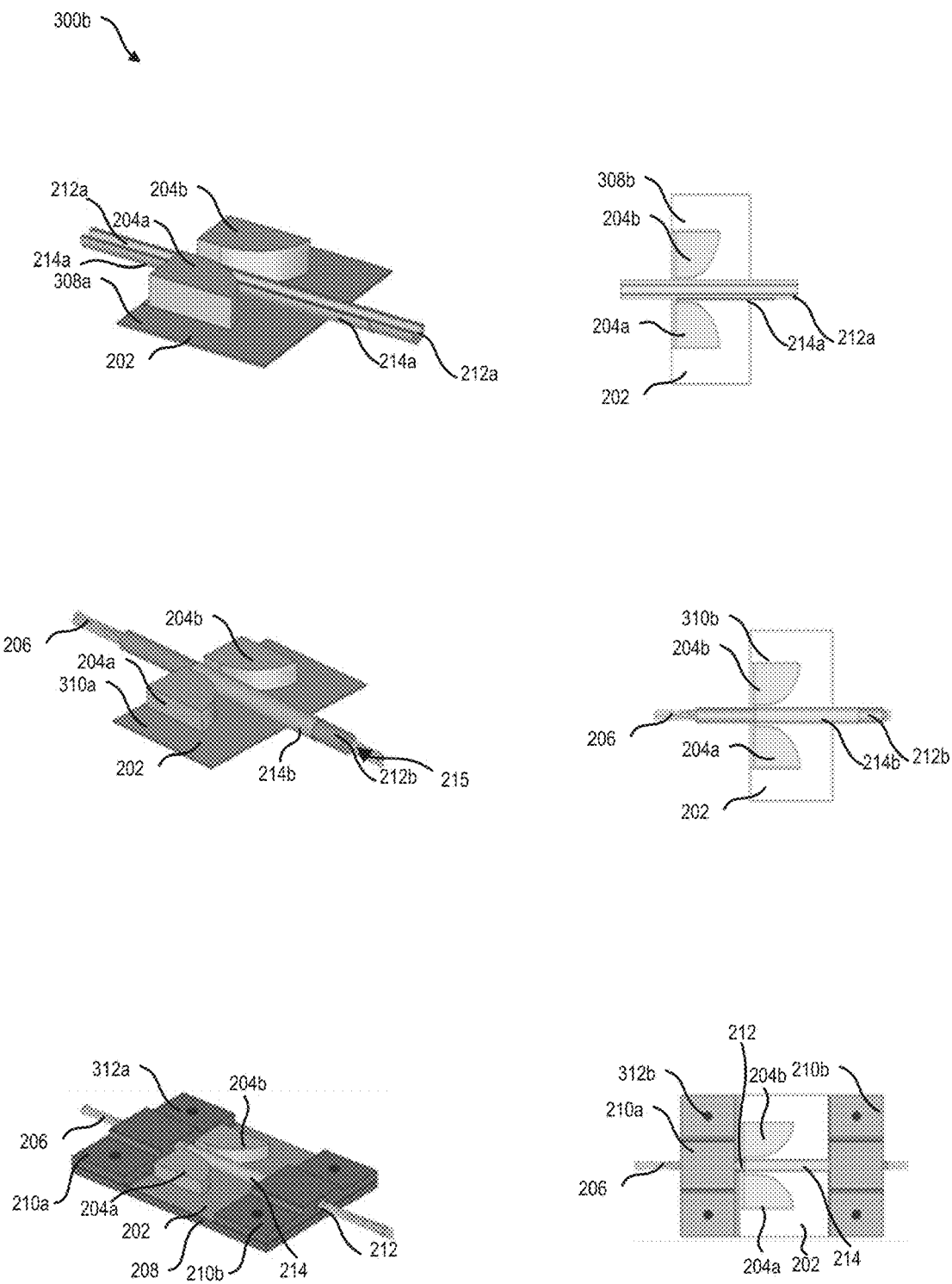

FIGS. 3A and 3B illustrate an exemplary method 300a-b of assembling the surface wave launcher 103 of FIG. 2, in accordance with at least one aspect described in the present disclosure. The PCB 202 including the conductor pin 301 (vertically coming from the back side) and the one or more ground pads 303 may be provided. A perspective view 302a and a top view 302b of the PCB 202 are illustrated in FIG. 3A.

The ground plates 204a-b may be physically positioned proximate the ground pads 303. The ground plates 204a-b may be electrically coupled to the ground pads 303. In addition, the ground plates 204a-b may be mechanically coupled to the PCB 202. The ground plates 204a-b may be physically positioned proximate the conductor pin 301. A perspective view 304a and a top view 304b of the PCB 202 with the ground plates 204a-b mounted are illustrated in FIG. 3A.

The PCB 202 may be physically positioned proximate the support structure 208. The support structure 208 may define an opening (not illustrated in FIG. 3A). The PCB 202 may be physically positioned relative to the opening of the support structure 208 such that the opening is proximate a back side of the PCB 202. A perspective view 306a and a top view 306b of the PCB 202 attached to the support structure 208 are illustrated in FIG. 3A.

A first portion of the cylinder 214a may be physically positioned relative the PCB 202 such that the conductor pin 301 and the first portion of the cylinder 214a are electrically coupled. In addition, the first portion of the cylinder 214a may be physically positioned proximate the ground plates 204a-b. The first portion of the cylinder 214a may be physically positioned proximate the ground plates 204a-b such that at least a portion of the first portion of the cylinder 214a is physically positioned between the ground plates 204a-b. A first portion of the insulator 212a may be physically positioned proximate the first portion of the cylinder 214a. The first portion of the insulator 212a may extend an entire length of the PCB 202 to avoid arcing between the power line 206 and any part of the PCB 202. A perspective view 308a and a top view 308b of the PCB 202 with the first portion of the cylinder 214a and the first portion of the insulator 212a are illustrated in FIG. 3B. The perspective view 308a and the top view 308b do not illustrate the support structure 208 for simplicity of illustration.

During installation, the PCB 202, the first portion of the cylinder 214a, and the first portion of the insulator 212a may be physically positioned relative the power line 206. The PCB 202, the first portion of the cylinder 214a, and the first portion of the insulator 212a may be physically positioned relative the power line 206 such that the first portion of the insulator 212a is physically positioned proximate the power line 206. A second portion of the insulator 212b may be physically positioned proximate the first portion of the insulator 212a and the power line 206. A second portion of the cylinder 214b may be physically positioned proximate the second portion of the insulator 212b such that the first portion of the cylinder 214a and the second portion of the cylinder 214b define the cylinder opening 215. At least a portion of the first portion of the insulator 212a and the second portion of the insulator 212b may be physically positioned within the cylinder opening 215. In addition, the power line 206 may extend through the cylinder opening 215. A perspective view 310a and a top view 310b of the PCB 202 with the second portion of the cylinder 214b and the second portion of the insulator 212b in the assembled state are illustrated in FIG. 3B.

During installation, the clamps 210a-b may be attached to the support structure 208. The clamps 210a-b may be attached to the support structure 208 such that at least a portion of the first portion of the cylinder 214a, the second portion of the cylinder 214b, the first portion of the insulator 212a, and the second portion of the insulator 212b are physically positioned between a portion of the clamps 210a-b and a portion of the support structure 208. The clamps 210a-b may be attached to the support structure 208 such that the second portion of the cylinder 214b physically contacts a portion of the first portion of the cylinder 214a and such that the second portion of the cylinder 214b is electrically coupled to the first portion of the cylinder 214a (e.g., forms the cylinder 214). The clamps 210a-b may be attached to the support structure 208 such that a portion of the second portion of the insulator 212b physically contacts a portion of the first portion of the insulator 212a and such that the first portion of the cylinder 212a and the second portion of the insulator 212b form the insulator 212.

In the assembled state, the clamps 210a-b may secure the insulator 212 between the cylinder 214 and a portion of the power line 206. The clamps 210a-b may ensure a physical proximity between the cylinder 214 and the conductor pin 301 is maintained to ensure electrical coupling between the cylinder 214 and the conductor pin 301. The clamps 210a-b may apply a compressive pressure to the cylinder to secure the insulator 212 between at least a portion of the cylinder 214 and a portion of the power line 206.

In the assembled state, the insulator 212 may be physically positioned proximate the power line 206 such that the cylinder 214 is mechanically isolated from the power line 206. In addition, the insulator 212 may be physically positioned proximate the power line 206 such that the cylinder 214 is electrically isolated from power signals that traverse the power line 206. A perspective view 312a and a top view 312b of the assembled structure in the assembled state are illustrated in FIG. 3B.

The PCB 202 may include a SMA connector or any other appropriate RF connector at the back side (not illustrated in FIGS. 3A and 3B). A center conductor of the SMA connector may be electrically coupled to the conductor pin 301. A ground portion of the SMA connector may be electrically coupled to the ground pad 303 and subsequently the ground plates 204a-b.

During installation, the assembled structure may be physically positioned proximate a power pole and may include a mechanical support that is mechanically coupled to the power pole. PCB ground plates may be screwed to the PCB 202 and they may be soldered to the ground pads on the PCB 202. In addition, a copper adhesive tape may electrically couple the conductor pin 301 to the cylinder 214.

Figure 4:
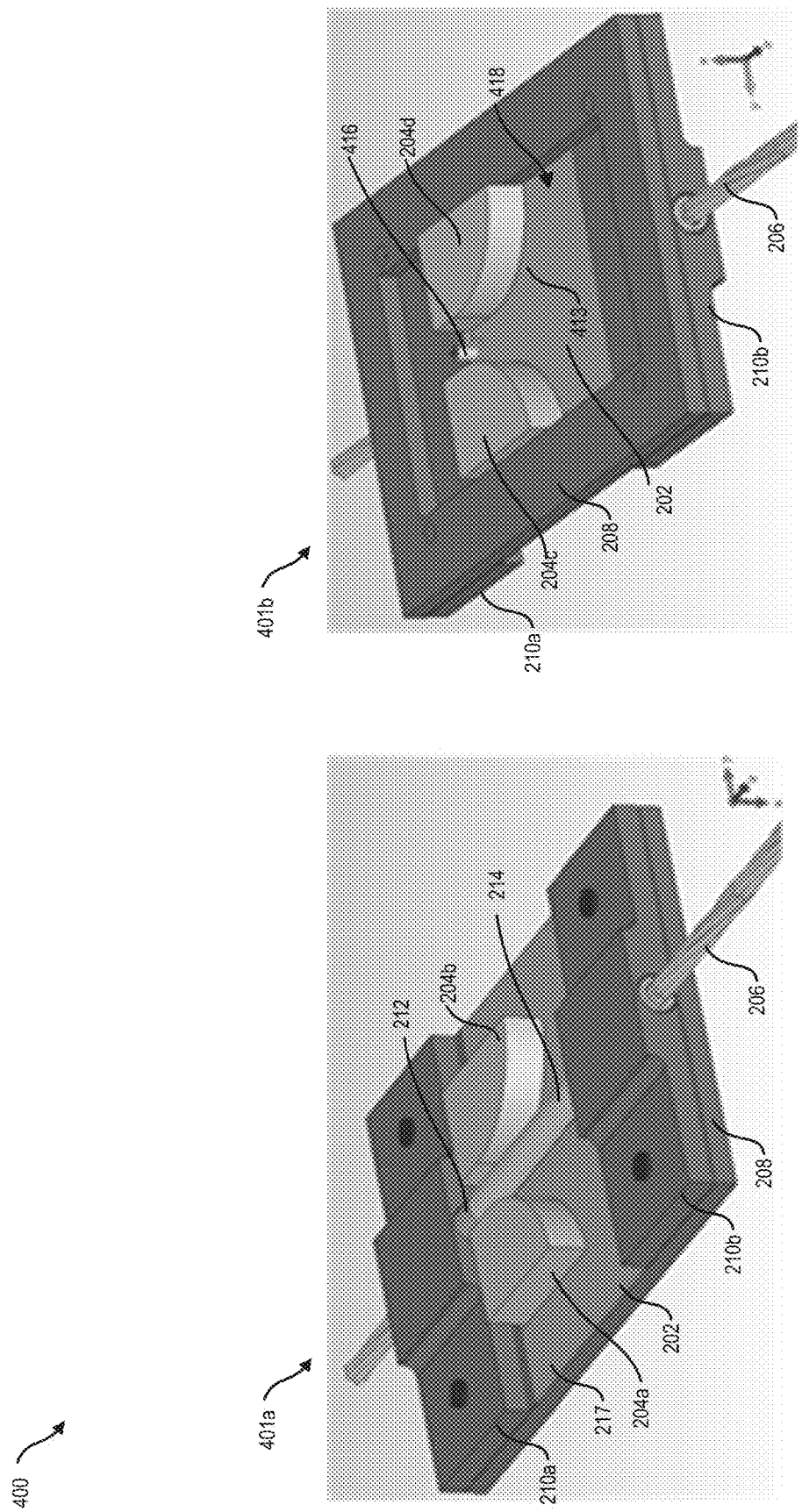

FIG. 4 illustrates an exemplary surface wave launcher 400a-b that may be implemented in the environment 100 of FIG. 1, in accordance with at least one aspect described in the present disclosure. The surface wave launcher 103 is illustrated in FIG. 4 as being in the assembled state. The discussion related to FIG. 4, is directed to when the surface wave launcher 103 is in the assembled state. The surface wave launcher 400 may correspond to the surface wave launcher 103 described in the present disclosure. A top perspective view 401a and a bottom perspective view 401b of the surface wave launcher 400 are illustrated in FIG. 4.

The ground plates 204a-b, the cylinder 214, and the insulator 212 may be physically positioned proximate the first surface 217 of the PCB 202. Additional ground plates 204c-d and a RF connector 416 may be physically positioned proximate and attached to a second surface 413 of the PCB 202. The RF connector 416 may be configured to mechanically and electrically couple to a cable to receive or send RF signals. The second surface 413 of the PCB 202 may be physically positioned proximate an opening 418 defined by the support structure 208.

Figure 5:
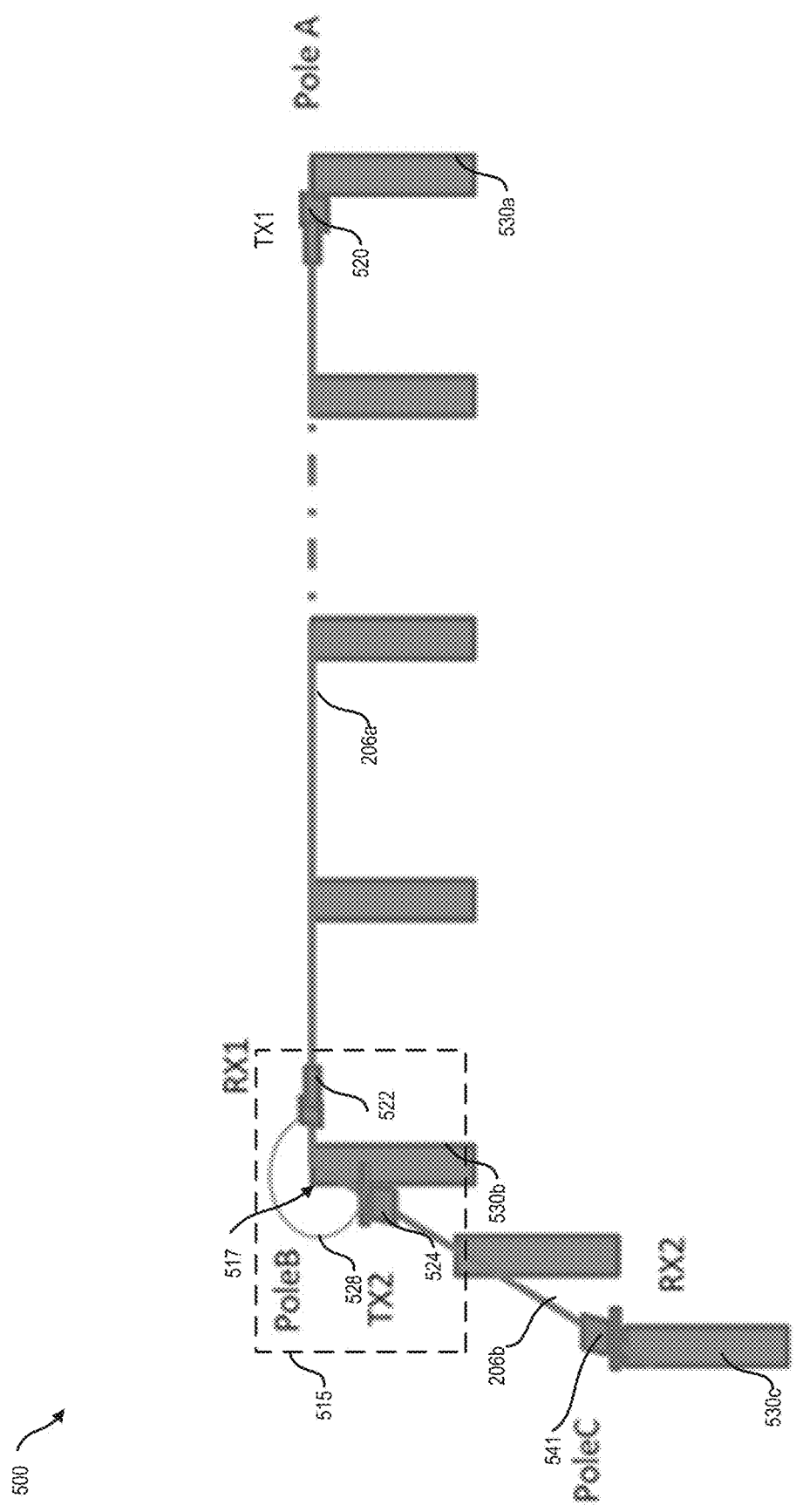

FIG. 5 illustrates a block diagram of an exemplary operational environment 500 to provide data links over power lines 206a-b, in accordance with at least one aspect described in the present disclosure. As illustrated in FIG. 5, the power lines 206a-b connect various power poles 530a-c. As illustrated in FIG. 5, the power lines 206a-b may include a physical change 517 proximate the second power pole 530b.

The environment 500 may include a first surface wave launcher (transmitter) 520, a loss compensation device 515, and a second surface wave receiver 541. The first surface wave launcher (transmitter) 520 may be physically positioned proximate the power line 206a. The first surface wave launcher (transmitter) 520 may launch a surface wave on the power line 206a. The loss compensation device 515 may be physically positioned proximate the physical change 517. The loss compensation device 515 may include a cable 528, a first surface wave receiver 522, and a second surface wave launcher (transmitter) 524. The first surface wave receiver 522 may be physically positioned proximate the power line 206a on a first side of the physical change 517. The second surface wave launcher (transmitter) 524 may be physically positioned proximate the power line 206b on a second side of the physical change 517.

The first surface wave launcher (transmitter) 520 may launch the surface wave on the power line 206a proximate the first power pole 530a. The first surface wave receiver 522 may receive the surface wave with the TM mode and may convert the surface wave to a RF signal with the TEM mode. The RF signal with the TEM mode may traverse the cable 528. The RF signal may traverse the cable to bypass the physical change 517 (e.g., to avoid loss in the power lines 206a-b due to the physical change 517). The second surface wave launcher (transmitter) 524 may receive the RF signal with the TEM mode and convert it to a surface wave with the TM mode. The second surface wave launcher (transmitter) 524 may launch the surface wave on the power line 206 downstream of the physical change 517. The second surface wave receiver 541 may receive the surface wave and convert the surface to a RF signal with the TEM mode.

The first surface wave launcher (transmitter) 520 may correspond to the surface wave launcher 103a of FIG. 2 or FIG. 4. The loss compensation structure 515 (the surface wave receiver 522, the cable 528, and the second surface wave launcher (transmitter) 524) may correspond to the repeater 105 of FIG. 1. The second surface wave receiver 541 may correspond to the surface wave receiver 103b of FIG. 2 or FIG. 4.

Figure 6:
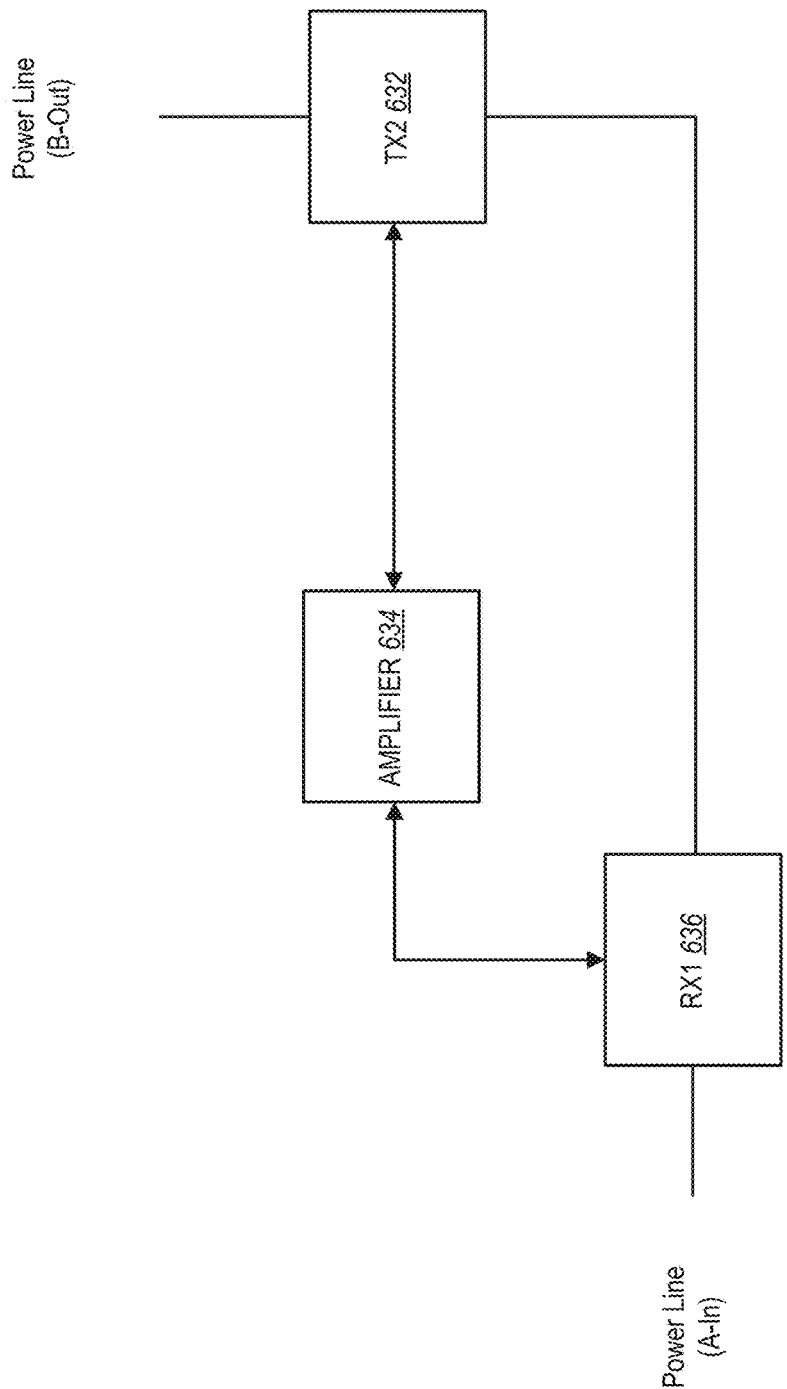

FIG. 6 illustrates an exemplary loss compensation device 515 that may be implemented in the environment 500 of FIG. 5, in accordance with at least one aspect described in the present disclosure. The loss compensation device 515 may include a surface wave receiver 636, an amplifier 634, and a surface wave launcher (transmitter) 632. As illustrated in FIG. 6, the power line directly between the receiver 636 and the transmitter 632 may include a bend or a fork or any other discontinuity. That discontinuity may create loss of surface waves.

To compensate for the loss due to the physical change in the power line, the receiver 636 may convert surface waves to RF signals. The receiver 636 may provide the RF signals to the amplifier 634. The amplifier 634 may amplify the RF signals. The amplifier 634 may amplify the RF signals to compensate for loss due to the receiver 636 converting the surface wave with the TM mode to the RF signal with the TEM mode. In addition, the amplifier 634 may compensate for the surface wave launcher (transmitter) 632 converting the RF signal with the TEM mode to the surface wave with the TM mode. The amplifier 634 may provide the amplified RF signal to the surface wave launcher (transmitter) 632 after the physical change in the power line. The surface wave launcher (transmitter) 632 may convert the amplified RF signal to the surface wave with the TM mode. The surface wave launcher (transmitter) 632 may launch the surface wave on the power line downstream of the physical change in the power line. The amplifier 634 may amplify the RF signal at the Wi-Fi frequency band (e.g., 2.4 GHz/five GHz), the cellular frequency band, the 5G frequency band, or whichever frequency band is applicable to the surface wave launcher.

Figure 7:
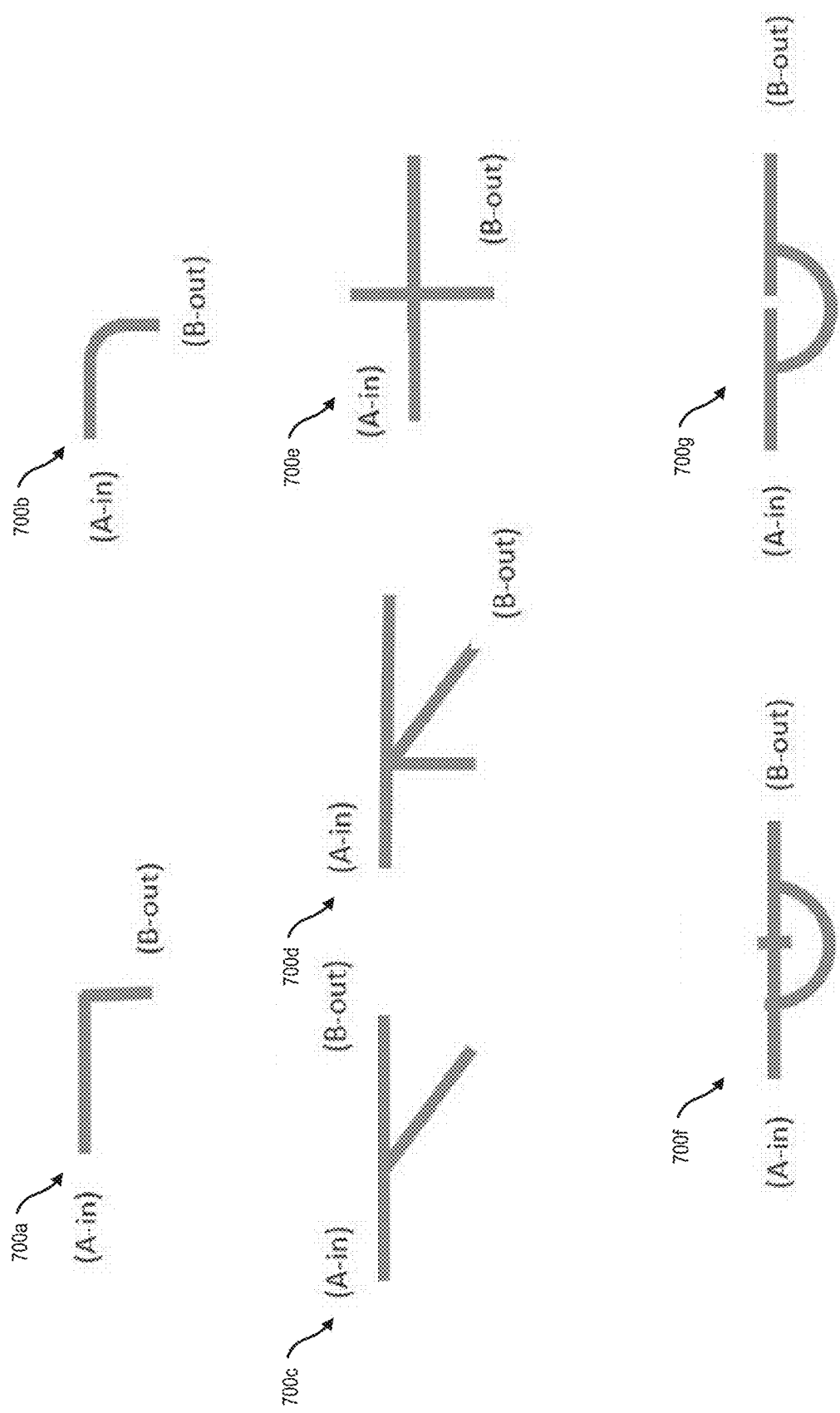

FIG. 7 illustrate exemplary physical changes in the power lines 206a-b that may occur in the environment 500 of FIG. 5, in accordance with at least one aspect described in the present disclosure. The physical changes may include a sharp bend 700a, a gradual bend 700b, fork topologies 700c-e, a second cable at a joint 700f, or a break 700g.

The loss compensation device 515 may include the surface wave receiver 522 physically positioned at points A (e.g., A—in) upstream of the physical change and a transmitter (e.g., the surface wave launcher (transmitter) 524) physically positioned at points B (e.g., B—out) downstream of the physical change as shown in FIG. 6. In addition, the loss compensation device 515 may include the surface wave receiver 522 physically positioned at points A (e.g., A—in) and the surface wave launcher (transmitter) 524 positioned at points B (e.g., B—out) and a second transmitter (e.g., the surface wave launcher (transmitter) 524) physically positioned on the different topologies shown in FIG. 7.

The fork topologies 700c-e may include intersections of multiple power lines. For the second cable at a joint topology 700f, surface waves may deteriorate due to the multiple cable intersections. The second cable at a joint topology 700f may include an additional cable at the joint. In the break configuration 700g, degradation of the surface waves may occur. For all these topologies the loss compensation device may be placed from point A (A—in) to point B (B—out) to bypass the intersections.

Figure 8:
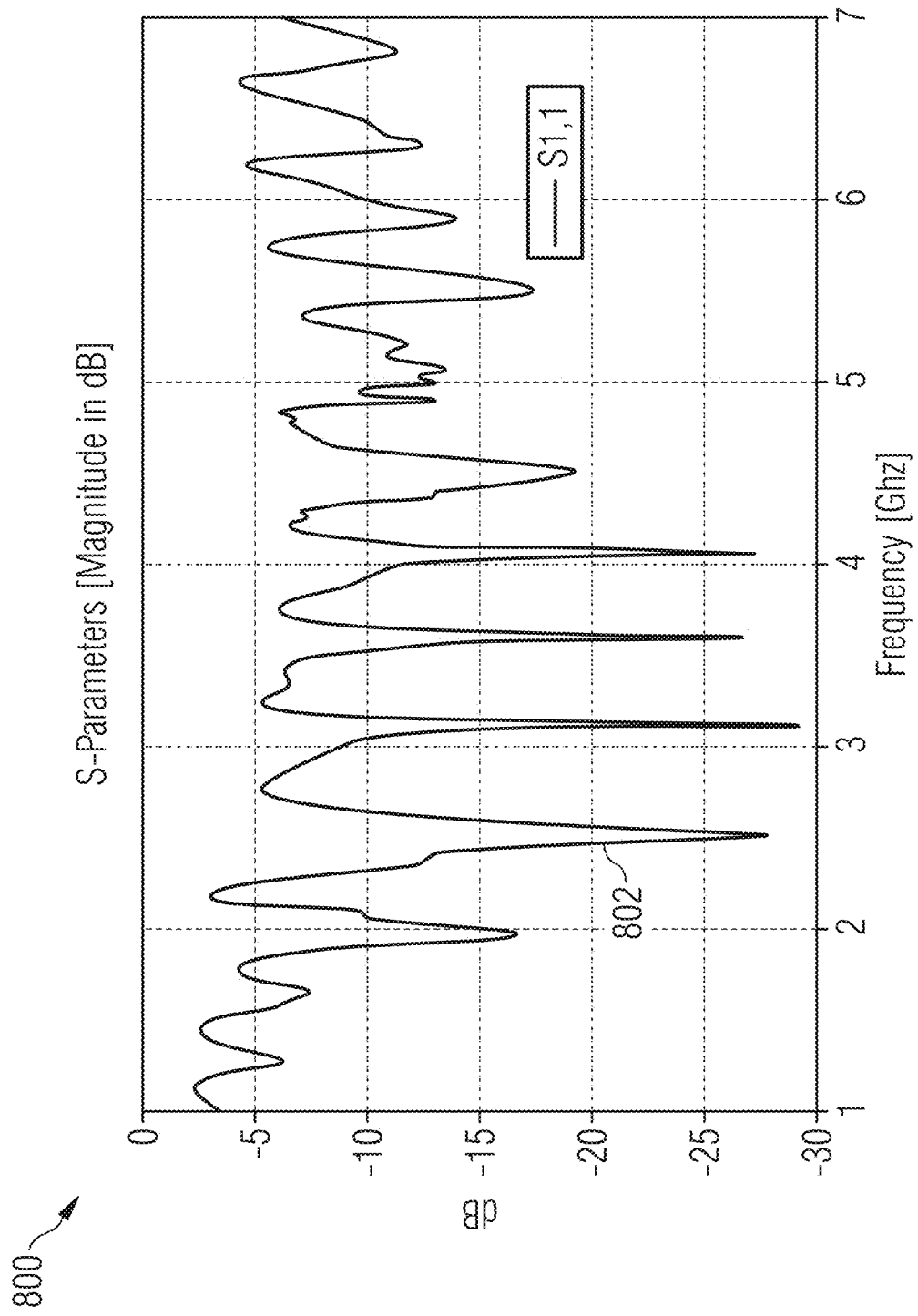

FIG. 8 illustrates a graphical representation 800 of a simulation of return loss for the surface wave launcher 103 of FIG. 2, in accordance with at least one aspect described in the present disclosure. For the simulation, the surface wave launcher 103 of FIG. 2 was simulated using 3D Electromagnetic Solver. Curve 802 illustrates the measured return loss of the surface wave launcher 103. The curve 802 indicates a return loss (in the broadband frequency band) occurs without major oscillations. During the simulation, the return loss in the Wi-Fi band of 5 GHz the return loss was measured below −5 decibels (dB) and reaches −10 dB.

Figure 9:
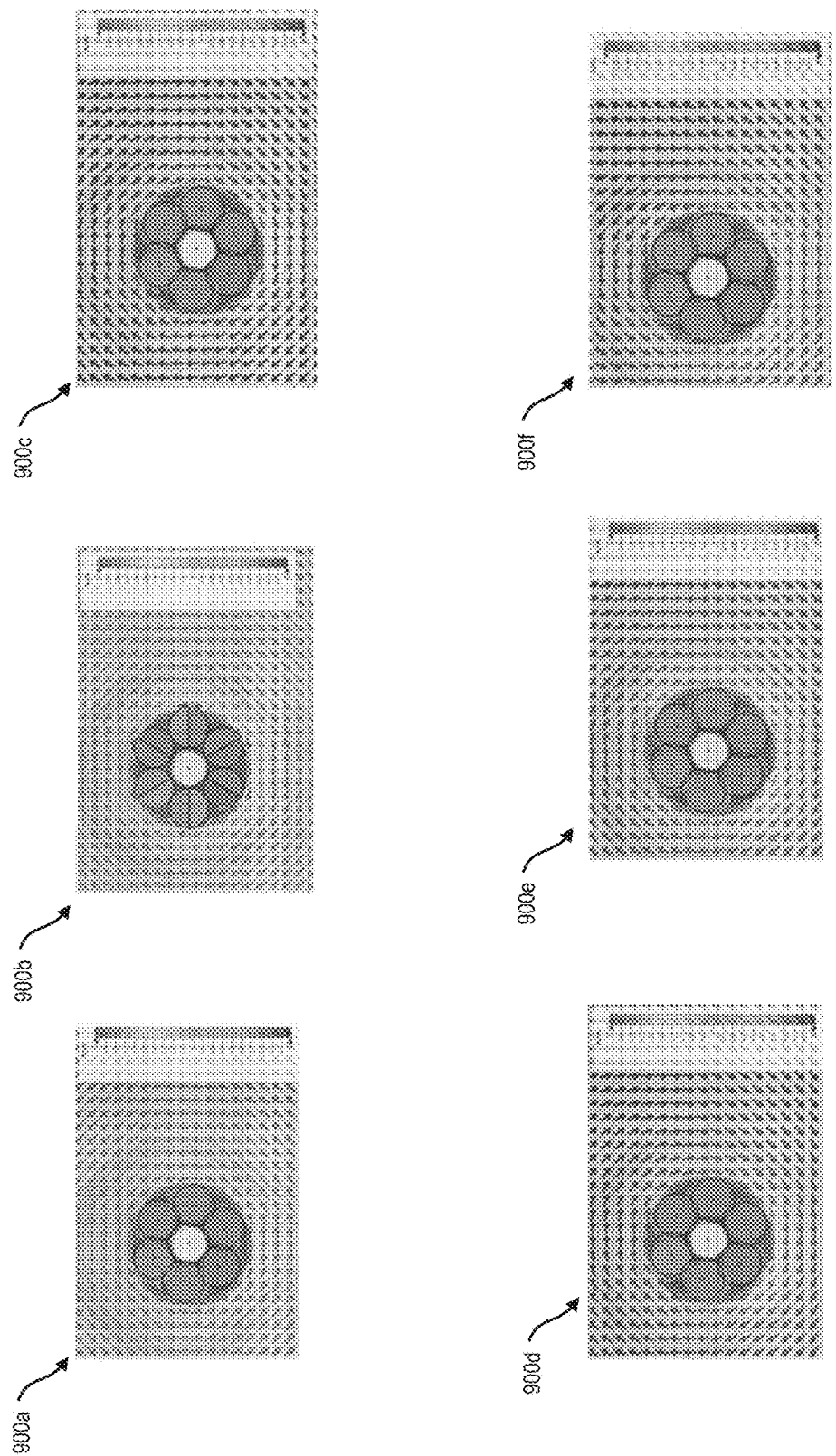

FIG. 9 illustrates graphical representations 900a-f of simulations of H fields of the surface wave launcher 103 of FIG. 2 at various frequencies, in accordance with at least one aspect described in the present disclosure. As illustrated in the graphical representations 900a-f, as the frequency changes, the H fields include a stable TMO1 mode pattern. Graphical representation 900a illustrates the H field of the surface wave launcher 103 at one GHz. Graphical representation 900b illustrates the H field of the surface wave launcher 103 at two GHz. Graphical representation 900c illustrates the H field of the surface wave launcher 103 at three GHz. Graphical representation 900d illustrates the H field of the surface wave launcher 103 at four GHz. Graphical representation 900e illustrates the H field of the surface wave launcher 103 at 5.5 GHz. Graphical representation 900f illustrates the H field of the surface wave launcher 103 at six GHz. As shown in FIG. 9 from one GHz to six GHz, the H field pattern may be stable.

Figure 10:
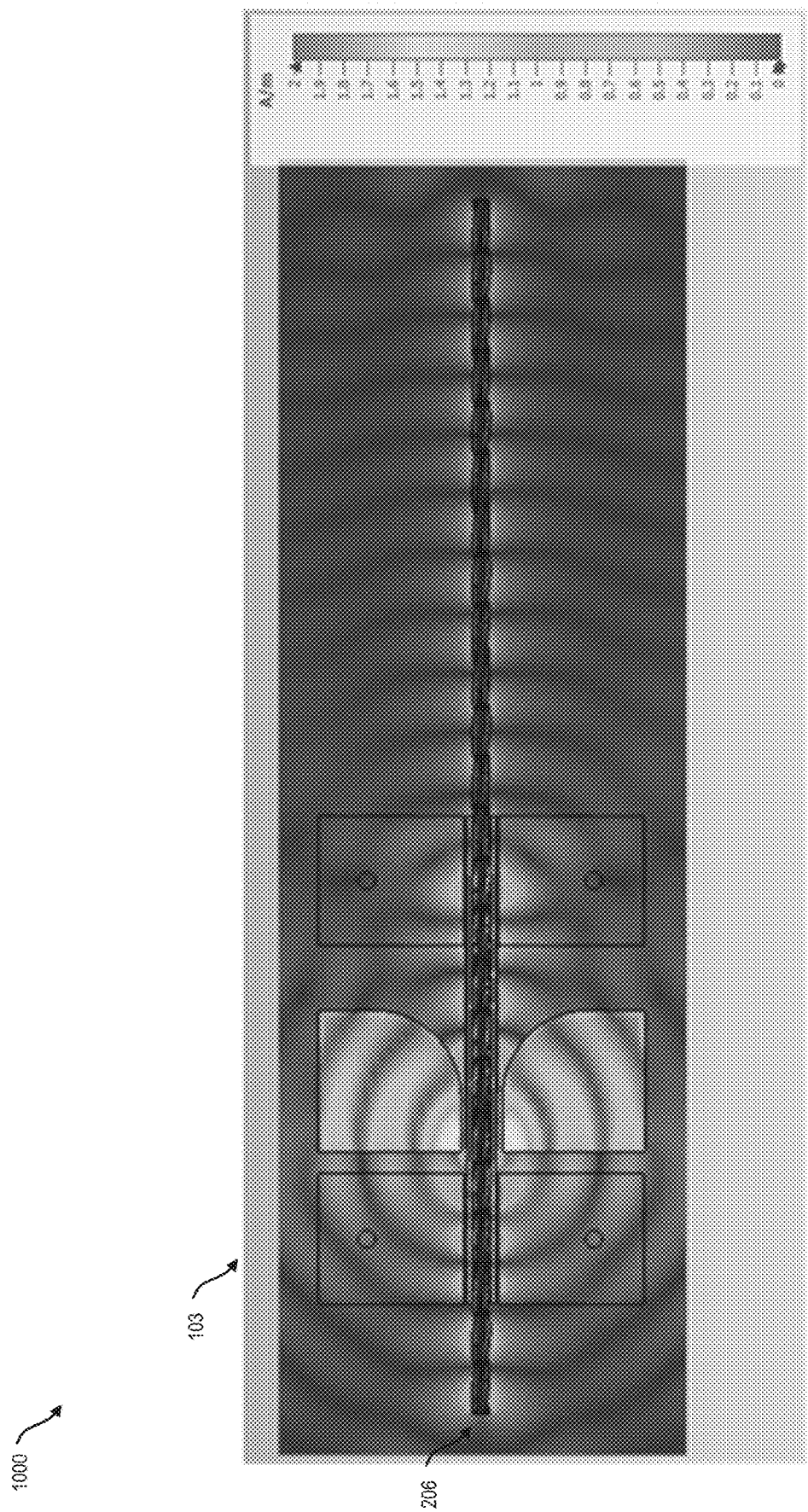

FIG. 10 illustrates a graphical representation 1000 of a simulation of surface currents for the surface wave launcher 103 and the power line 206 of FIG. 2, in accordance with at least one aspect described in the present disclosure. As illustrated in the graphical representation 1000, the surface currents traverse the power line 206 in directions away from the surface wave launcher 103, on a surface of the power line.

Figure 11:
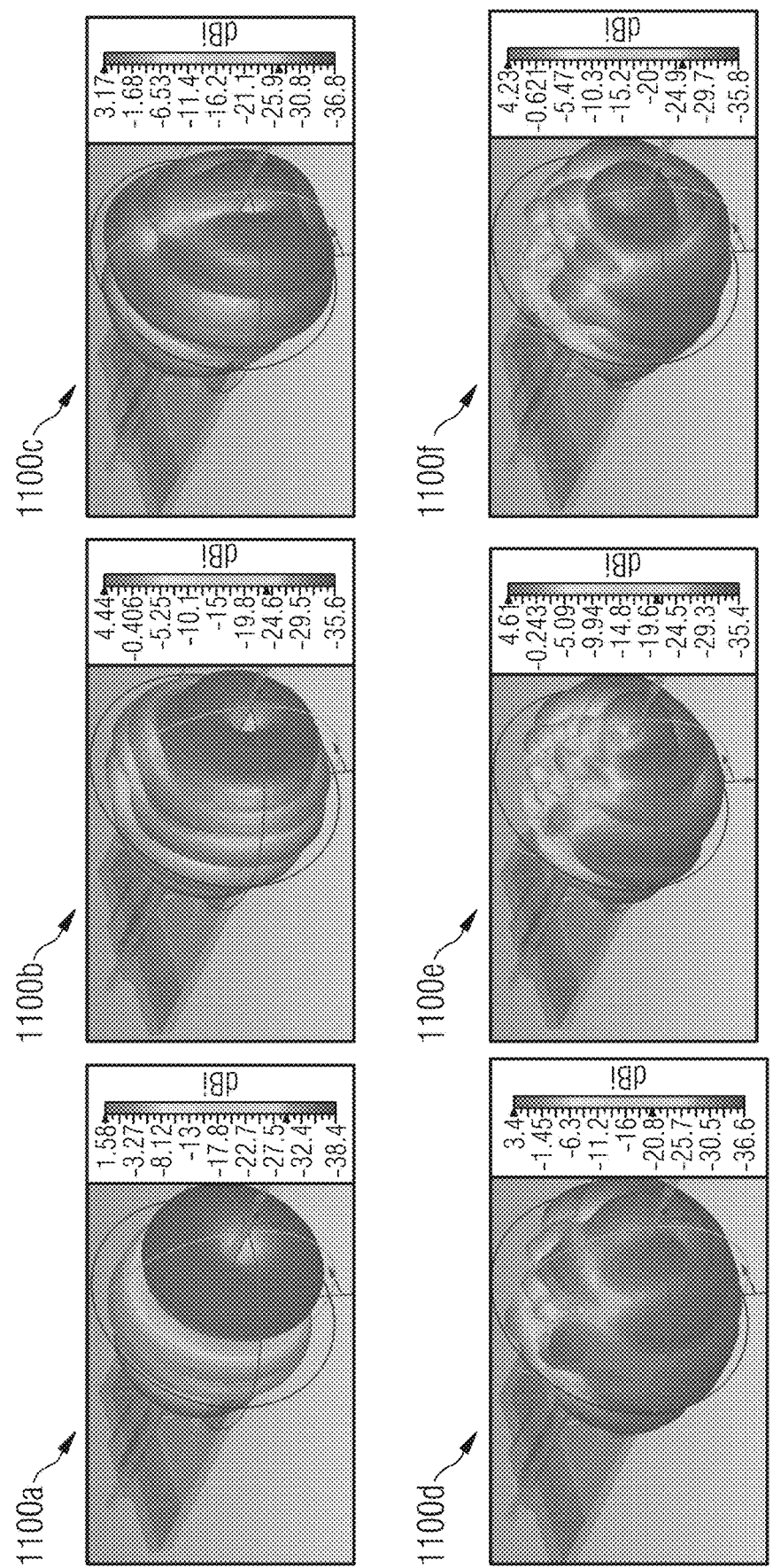

FIG. 11 illustrates graphical representations 1100a-f of simulations of radiation patterns of the surface wave launcher 103 of FIG. 2 at various frequencies, in accordance with at least one aspect described in the present disclosure. As illustrated in FIG. 11, a null or reduced radiation at line of sight for broadband frequencies (e.g., one to six GHz) exists for the surface wave launcher 103. A lower radiation rate indicates more power is transferred to the surface wave propagation on the power lines.

Graphical representation 1100a illustrates the radiation pattern of the surface wave launcher 103 at one GHz. Graphical representation 1100b illustrates the radiation pattern of the surface wave launcher 103 at two GHz. Graphical representation 1100c illustrates the radiation pattern of the surface wave launcher 103 at three GHz. Graphical representation 1100d illustrates the radiation pattern of the surface wave launcher 103 at four GHz. Graphical representation 1100e illustrates the radiation pattern of the surface wave launcher 103 at 5.5 GHz. Graphical representation 1100f illustrates the radiation pattern of the surface wave launcher 103 at six GHz.

Figure 12B:
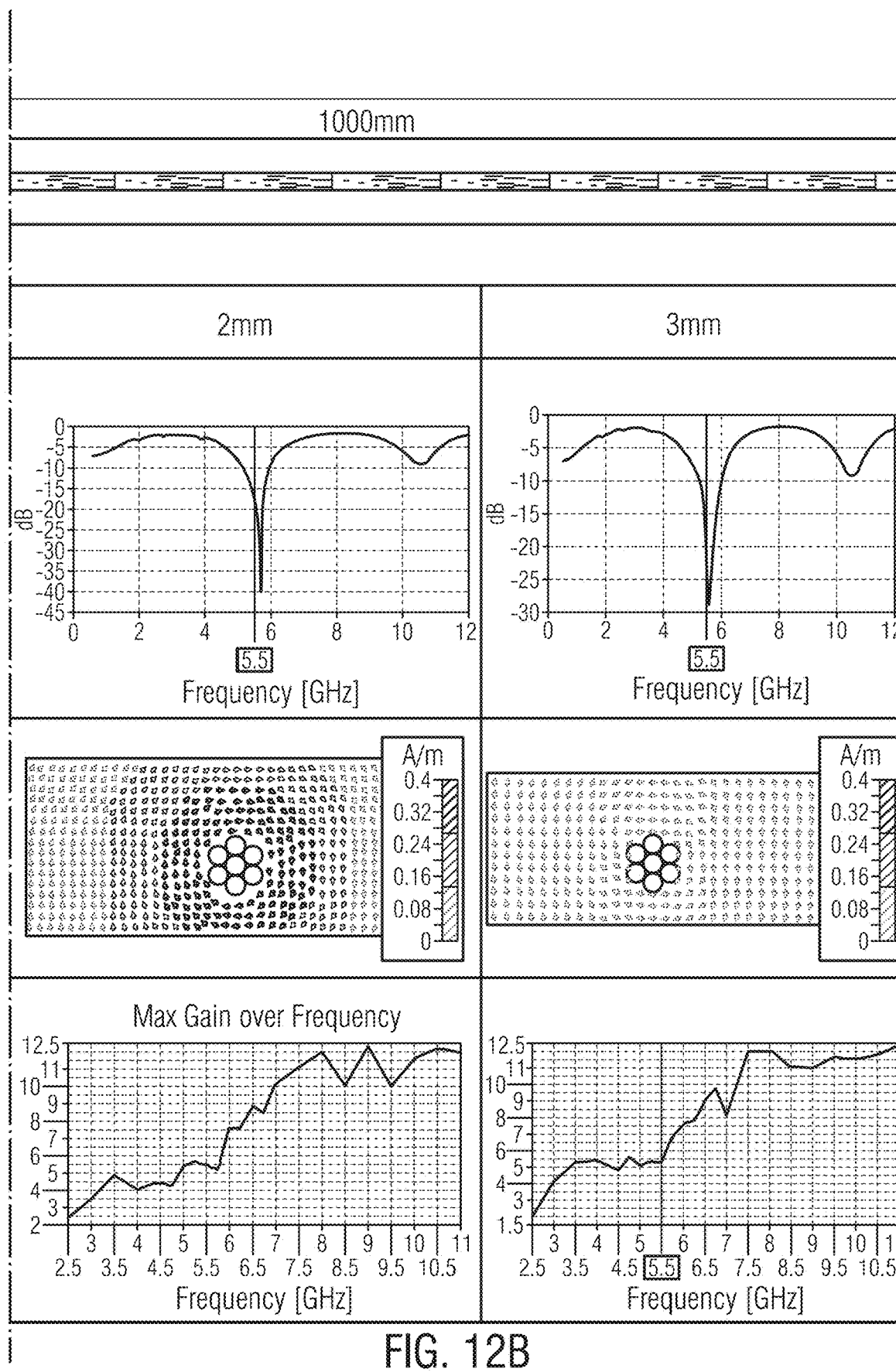
Figure 12C:
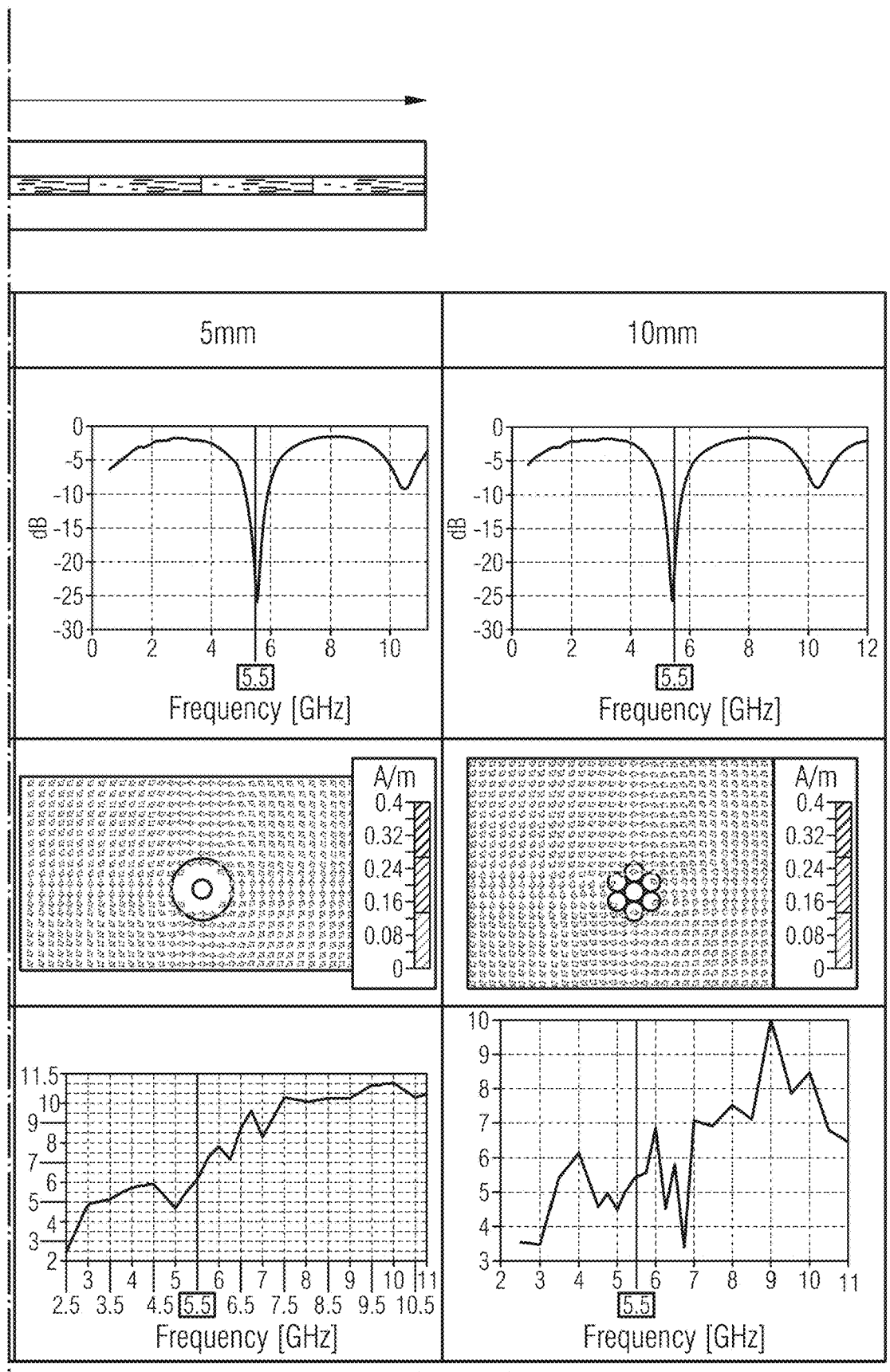

FIGS. 12A-12C illustrate a graphical representation 1200 of simulations of return loss, H Field, and max gain vs. frequency of the surface wave launcher 103 of FIG. 2 with various thicknesses of the insulator 212, in accordance with at least one aspect described in the present disclosure. The graphical representation 1200 illustrates that as the thickness of the insulator 212 changes between one millimeter (mm); two mm; three mm; five mm; and ten mm, the return loss; the H Field; and the max gain vs. frequency of the surface wave launcher 103 changes.

Based on the graphical representation 1200, the insulator with a thickness around two mm, provides the best ratings of the H field and the return loss versus the other thicknesses. The example thickness of the insulator of around two mm is just for illustrative purposes to show the impact of insulation thickness on performance of the surface wave launcher. The insulator may include different types of materials and the thickness of the insulator may differ based on the electrical properties of the different materials, a frequency of operation, and the structure dimensions.

Figure 13:
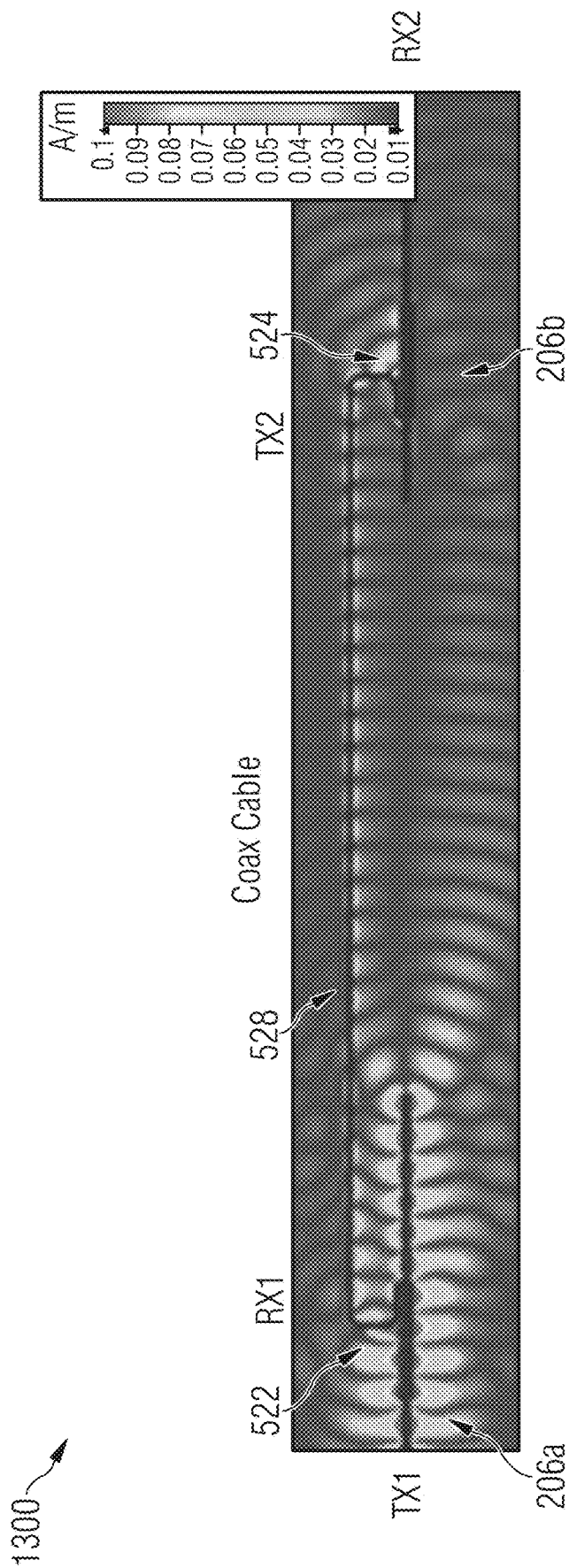

FIG. 13 illustrates a graphical representation 1300 of a simulation of surface currents for the surface wave launcher 103 and the power line 206a-b, in accordance with at least one aspect described in the present disclosure. Surface waves may traverse from left to right in FIG. 13. The power line 206a-b may include an improper connection or other physical change (e.g., a bend/break/fork). Surface waves may not traverse the entire power line 206a-b due to the physical change. In FIG. 13, the surface wave receiver 522 is physically positioned upstream of the physical change and the surface wave launcher (transmitter) 524 is physically positioned downstream of the physical change. The surface wave receiver 522 may convert the surface waves with TM mode to RF signals with TEM mode. A coaxial cable 528 may propagate the RF signals with the TEM mode and provide the RF signals to the surface wave launcher (transmitter) 524. Downstream of the physical change, the surface wave launcher (transmitter) 524 may convert the RF signal to the surface wave with the TM mode and launch the surface wave downstream the physical change. As illustrated in FIG. 13, a reduced surface current proximate the coaxial cable 528 and increased surface currents upstream and downstream the physical change indicates the surface wave does not traverse the physical change well.

The surface wave launcher 103 described in the present disclosure may be configured to be in the assembled state or a disassembled state. The discussion related to FIGS. 2 and 4 are directed to the surface wave launcher 103 in the assembled state. In addition, the assembled state may include an installed state in which the surface wave launcher 103 is installed on the power line.

In the disassembled state, the surface wave launcher 103 may include multiple components that are not mechanically or electrically coupled to each other. For example, the cylinder may be mechanically coupled to or separated from the PCB, the clamps, or other components of the surface wave launcher 103. As another example, the insulator may be mechanically coupled to or separated from the cylinder or other components of the surface wave launcher 103. As yet another example, the insulator may be mechanically separated from the power line.

A surface wave launcher that includes a three-dimensional flared patch may launch a surface wave on power lines. The surface wave launcher may be wrapped around the power line. The surface wave launcher may include an insulator and a cylinder. In an assembled state, the insulator may be physically positioned between the power line and the cylinder. The insulator may prevent the power line from contacting the cylinder or any part of the surface wave launcher.

The surface wave launcher may include a conductor pin that is electrically coupled to the cylinder. The conductor pin may receive a RF signal with a TEM mode from the SMA/RF connector. In addition, the surface wave launcher may convert the RF signal to the surface wave with a TM mode. The cylinder and the ground plates may form a coplanar Goubau line and at the end of the plates form a Goubau line structure and may produce the surface wave and launch the surface wave on the power line that extends through a cylinder opening defined by the cylinder. The cylinder may launch the surface wave on power lines via electromagnetic coupling. Dimensions of the insulator may be such that that the coupling from the cylinder to the power line is maximized.

A surface wave launcher that includes a three-dimensional flared patch may launch a surface wave on power lines. The surface wave launcher may be wrapped around the power line. The surface wave launcher may include an insulator and a cylinder. In an assembled state, the insulator may be coupled to the surface wave launcher via a cable and a RF connector of the surface wave launcher. The RF connecter may propagate the RF signal to a conductor pin of the surface wave launcher. In addition, a ground portion of the RF connector may be electrically coupled to a ground pad of the surface wave launcher. The ground pad may be electrically coupled to ground plates that create a ground reference for the surface wave launcher. The ground plates may create a 3D coplanar structure in which the cylinder forms a center conductor and the ground plates are flared 3D ground plates.

In the assembled state, the cylinder may be electrically isolated from power signals that traverse the power line by the insulator. The cylinder may be wirelessly coupled to the power line via electromagnetic coupling. Further, the surface wave launcher may convert the RF signal to the surface wave with the TM mode. The conductor pin may be electrically coupled to the cylinder. The cylinder may launch the surface wave on the power line via the electromagnetic coupling.

The surface wave launcher may launch the surface wave using TEM to TM01 mode conversion with a broadband stable H field response, null or lower radiation at LOS, or some combination thereof.

Table I illustrates the surface wave launcher described in the present disclosure versus other power line technologies.

TABLE I

|  | Surface Wave Launcher described in the Present Disclosure | Technology 1 | Technology 2 | Technology 3 | Technology 4 |
|---|---|---|---|---|---|
| Power line and center conductor | Power line extends through cylinder coupling via EM waves | Power line extends through, cylinder coupler via EM waves | Power line extends through, cylinder coupler via EM waves | End to end SMA connection, direct connection | End to end SMA connection, direct connection |
| Ground | Flared 3D ground | Conical flared structure | Planar PCB Ground | Flared 2D planar ground for broadband impedance | Flared Gaussian ground for broadband impedance |
| Materials | 2.5 mm thick Porcelain Insulator. Polyletrafluoroethylene (PTFE) for PCB. | PTFE insulating material | Two mm thick polyethylene material | No insulation material is used. PTFE is used for PCB | No dielectric material. |
| Other: | Broad band impedance, stable H field over frequency band one to seven GHz. Null at line of sight over the frequency band. | Generate narrow band H field with directional radiation at line of sight over the frequency band. | Low frequency application. | Broad band frequency. stable H field. Surface wave properties degrades when power line pass through. | Broad band frequency. stable H field. Surface wave properties degrades when power line pass through. |

One or more loss compensation devices may compensate for loss that occurs due to a physical change in the power lines. For example, a power line may include significant loss when there is a bend, a break, or a fork in the power line. The loss compensation devices may compensate for the loss due to the physical change in the power line.

A Wi-Fi modem may operate in Wi-Fi frequency bands (e.g., 2.4 GHz/five GHz/or Wi-Fi extended band six GHz). The Wi-Fi modem may provide a RF signal to the surface wave launcher. The Wi-Fi modem may be electrically Some surface wave launcher technologies may include a cone/horn type launcher. In addition, some surface wave launcher technologies may include a cone/horn piece implemented as a ground structure/reference. These surface wave launcher technologies may include a cylinder that is in direct contact with the power line. Power signals that traverse the power lines may include a voltage up to eleven kilovolts (kV). The direct connection between the cylinder and the power lines may be hazardous for the cylinder or other components of the surface wave launcher.

Some surface wave launcher technologies may include an insulator between the cylinder and the ground references. These surface wave launcher technologies may include a multi-folded ground. Further, some surface wave launchers may include a slit in the cylinder to attach the surface wave launcher to the power line. Some surface wave launcher technologies may be configured to operate in a terahertz frequency range. In addition, some surface wave launcher technologies may implement a planar Goubau line (PGL) structure and the power line may not extend through an opening defined by the surface wave launcher. These surface wave technologies may include a two-dimensional ground structure or a Gaussian ground structure.

The surface wave launcher described in the present disclosure may be referred to as a 3D flared patch launcher. The surface wave launcher described in the present disclosure may operate for broadband surface waves, which may increase throughput of the surface wave launcher. The surface wave launcher described in the present disclosure may form a portion of a loss compensation device to compensate for loss in power lines due to bends, breaks, forks, or some combination thereof.

The surface wave launcher, in the assembled state, may couple the cylinder to the power line via electromagnetic coupling while the cylinder is mechanically isolated from the power line by the insulator. The insulator may be configured for high voltage levels. In the assembled state, the insulator of the surface wave launcher may be physically positioned between the power line and the cylinder. The insulator may include a ceramic material (e.g., porcelain, alumina, zirconia), Reinforced Polymer or Composite Polymer material, silicone polyimide material, silicone rubber material, silicon elastomer material, or some combination thereof. In addition, the ground structure of the surface wave launcher may not be continuous. Further, the cylinder of the surface wave launcher may not include a slit in the cylinder so as to permit higher frequency signals to propagate the cylinder.

A Goubau Line (GL) may include a single wire transmission line. The surface wave launcher may include a GL structure without losing surface wave characteristics by permitting the power line to extend through the cylinder. In addition, the surface wave launcher may include a snap on installation process. The 3D flared ground structure may enhance the H field while reducing surface wave propagation in a back side of the surface wave launcher.

A surface wave launcher may include a PCB. The PCB may include a conductor pin. The conductor pin may be coupled to the RF connector. The PCB may also include one or more ground pads. The surface wave launcher may also include a cylinder. In the assembled state, the cylinder may be electrically coupled to the conductor pin. In the assembled state, the cylinder may also define a cylinder opening. The cylinder and ground plates may form a transition from planar to GL structure and may propagate the surface wave. The surface wave launcher may include an insulator. In the assembled state, the insulator may be physically positioned within at least a portion of the cylinder opening. In addition, in the assembled state, the insulator may be physically positioned between the cylinder and a portion of a power line that extends through the cylinder opening. In the assembled state, the insulator may mechanically isolate the cylinder from the power line and may extended beyond the cylinder in both directions. In addition, the insulator may permit the cylinder to launch the surface wave on the power line. The surface wave launcher may also include one or more ground plates (e.g., a ground plate structure). The one or more ground plates may be electrically coupled to the one or more ground pads. The one or more ground plates may provide a ground reference for the conductor pin and the cylinder. The conductor pin and the cylinder, in the assembled state, may be physically positioned proximate the one or more ground plates. There may be ground pads and plates at the back side of the PCB. The front side and back side ground pads and plates may be electrically coupled together.

The flaring up of the ground plates may improve impedance matching of the surface wave launcher. The conductor pin may receive a RF signal with a TEM mode. The surface wave launcher may convert the RF signal to the surface wave with a TM mode.

The surface wave launcher may also include a platform device. In the assembled state, the platform device may be mechanically coupled to at least a portion of the PCB. The platform device may include a non-conductive material with a dielectric constant close to that of the air. In these and other aspects. For example, the platform device may include a wood material.

The platform device may include a support structure and one or more clamps. In the assembled state, the one or more clamps may attach to the support structure. In addition, in the assembled state, the one or more clamps may apply a pressure to the cylinder to secure the insulator between at least a portion of the cylinder and a portion of the power line. Further, in the assembled state, the one or more clamps may apply a pressure to the cylinder to maintain a proximity between the cylinder and the conductor pin to maintain electrical coupling of the cylinder and the conductor pin.

The surface wave launcher may also include a RF connector (e.g., a SMA connector). The RF connector may include a center pin electrically coupled to the conductor pin. The RF connector may also include a ground portion. The ground portion may be electrically coupled to the ground pads. The RC connector may mechanically couple and electrically couple to a cable to receive RF signals.

The insulator, in the assembled state, may electrically isolate the cylinder from power signals that traverse the power line. The cylinder may launch the surface wave on the power line via electromagnetic coupling between the cylinder and the power line. The cylinder and the insulator may include a mechanical snap-on assembly for cylindrical surface conductor as well as the insulator.

The one or more ground plates may be shaped as flared ground plates. The one or more ground plates may flare in a direction away from the cylinder. The one or more ground plates may include a flared-up structure and a 3D structure on the PCB. In the assembled state, the one or more ground plates may flare in the direction away from the cylinder on a plane that is substantially parallel to a surface of the PCB. The one or more ground plates may form a three-dimensional ground structure for the surface wave launcher. The one or more ground plates may provide the ground reference for the conductor pin and the cylinder without a ground wire electrically coupled between the surface wave launcher and an external device.

The one or more ground plates may include a first plate physically positioned proximate the cylinder on a first side of the cylinder, in the assembled state. The one or more ground plates may also include a second ground plate physically positioned proximate the cylinder on a second side of the cylinder that is opposite the first side, in the assembled state.

The first ground plate and the second ground plate may be physically positioned proximate a first surface of the PCB.

The one or more ground plates may also include a third ground plate and a fourth ground plate physically positioned proximate a second surface of the PCB. The third ground plate and the fourth ground plate may enhance the surface wave propagation in the forward direction. The surface wave propagation may be further enhanced by constructing 3D vertical flared ground plates. The thickness of the ground plates may be adjusted to maximize the surface wave propagation in the desired direction. The first ground plate, the second ground plate, the third ground plate, the fourth ground plate, or some combination thereof may form the ground plate structure.

The conductor pin may be physically positioned proximate the cylinder on a third side on a plane that is orthogonal to a plane of the ground plates, in the assembled state. The conductor pin may be physically positioned proximate the cylinder on a third side on a plane that is not parallel to a plane of the ground plates, in the assembled state.

The insulator may include a material that includes a thickness between two millimeters and twelve millimeters. The thickness of the insulator may vary for performance variations. The insulator may withstand high voltage (eleven kV) power line energy and may not break down over time. The insulator may also withstand an outdoor environment in all seasons. One such material is porcelain which is a type of ceramic material.

The insulator may include a ceramic material. For example, the insulator may include at least one of a porcelain material, a Zirconia material, and an Alumina material. A breakdown voltage for porcelain material may be around five to six kV/mm. For eleven kV power lines, the insulator thickness may be around 2.2 mm. Other materials may include alumina, zirconia, Fiber Reinforced Polymer (FRP), composite polymer, silicone polyimide material, silicone rubber material, and silicone elastomer material.

The thickness of the insulator may vary based on the material of the insulator. If a different type of ceramic material is used, then the dielectric withstanding capability can be different. Alumina and Zirconia may include a higher dielectric withstanding capability. Thickness of the insulator may be selected based on the high voltage the insulator is to withstand. For example, if the power line is carrying thirty-three kV, then a three mm thickness of Alumina or Zirconia material may be used.

At least a portion of the PCB may include a PTFE material. The surface wave launcher may operate within Wi-Fi frequency bands.

The surface wave launcher, when assembled, may be configured to be physically positioned within an interior volume defined by an enclosure. For example, the entire structure of the surface wave launcher, when assembled, may be physically positioned in an enclosure or a box so as to protect the surface wave launcher from the outdoor environment. The enclosure may include a non-conductive material with a dielectric constant close to that of air. The enclosure may provide enough clearance from the power line to extend through the enclosure. This enclosure may receive mechanical support from the power pole. The enclosure may provide enough clearance to adjacent power lines.

A loss compensation device may compensate for loss in the power line due to breaks, bends, or forks in the power line. For example, a change of direction of the power line may create a sharp angle. As another example, a break may exist in the power line or the power line may terminate at a power pole and another power line may start at the power pole and situated at an angle. As yet another example, a small cable joining two continuous power lines may be present. Alternatively, the power line may include a bend. In all these cases, the physical change of the power line may cause attenuation of surface waves and loss of throughput.

Passive surface wave launchers described in the present disclosure may be used before and after the physical change in the power line to compensate for the loss due to the physical change. A passive surface wave launcher may be configured as a receiver and the passive surface wave launcher may receive the surface wave upstream of the physical change of the power line. The receiver may convert the surface wave to a RF signal with a TEM mode. A cable may electrically couple the receiver to the other surface wave launcher configured as a transmitter. The transmitter may receive the RF signal with the TEM mode. The transmitter may convert the RF signal to the surface wave with the TM mode. In addition, the transmitter may launch the surface wave on the power line downstream of the physical change. Throughput of the overall system may improve since the loss compensation device compensates for loss in the power line due to the physical change.

A distance between the transmitter, the repeater, the receiver, or the LAN may be between a few meters and four kilometers.

A broadband communication system may include a first transmitter. The first transmitter may be physically positioned proximate a power line. The first transmitter may launch a surface wave on the power line. The broadband communication system may also include a loss compensation device. The loss compensation device may be physically positioned proximate a physical change of the power line. The loss compensation device may include a receiver. The receiver may be physically positioned proximate the power line on a first side of the physical change of the power line. The receiver may receive the surface wave via the power line. In addition, the receiver may convert the surface wave to a RF signal. The loss compensation device may also include a second transmitter. The second transmitter may be physically positioned proximate the power line on a second side of the physical change of the power line. The second transmitter may receive the RF signal from the receiver through a coaxial cable. The second transmitter may also convert the RF signal to the surface wave. In addition, the second transmitter may launch the surface wave on the power line downstream of the physical change. The loss compensation device may bypass the physical change of the power line to compensate for loss due to the physical change of the power line.

The first transmitter may include a surface wave launcher. The surface wave launcher may include a first PCB. The first PCB may include a first conductor pin. The first conductor pin may receive a RF signal with a TEM mode. The first transmitter may also convert the RF signal to the surface wave with a TM mode. The surface wave launcher may also include one or more ground pads. The surface wave launcher may include a first cylinder. The first cylinder may be electrically coupled to the first conductor pin. The first cylinder may define a first cylinder opening. The first cylinder and the first ground plates may form a transition from coplanar to GL structure and the first cylinder may generate and also propagate the surface wave. Further, the surface wave launcher may include a first insulator. The first insulator may be physically positioned within at least a portion of the first cylinder opening and between the first cylinder and the power line extending through the first cylinder opening. The first insulator may mechanically isolate the first cylinder from the power line. The first insulator may also permit the first cylinder to launch the surface wave on the power line by electrical coupling. The surface wave launcher may include one or more ground plates. The one or more ground plates may be electrically coupled to the one or more ground pads. The one or more ground plates may provide a ground reference for the first conductor pin and the first cylinder. The first conductor pin and the first cylinder may be physically positioned proximate the one or more ground plates.

The loss compensation structure may include a first receiver, a cable, and a second transmitter. The surface wave launcher (transmitter) may be configured as a receiver. The receiver may include a second cylinder. The second cylinder may define a second cylinder opening. The second cylinder may receive the surface wave from the power line. The second cylinder may convert the surface wave to a RF signal. The receiver may also include a second insulator. The second insulator may be physically positioned within at least a portion of the second cylinder opening and between the second cylinder and the power line extending through the second cylinder opening. The second insulator may mechanically isolate the second cylinder from the power line. The second insulator may also permit the second cylinder to receive the surface wave from the power line. The receiver may include a second PCB. The second PCB may include a second conductor pin. The second conductor pin may be electrically coupled to the second cylinder. The second conductor pin may receive the RF signal from the second cylinder. The surface wave receiver may also convert the surface wave with the TM mode to the RF signal with the TEM mode. The second PCB may also include one or more ground pads. The receiver may include one or more ground plates. The one or more ground plates may be electrically coupled to the one or more ground pads. The one or more ground plates may provide a ground reference for the second conductor pin and the second cylinder. The second conductor pin and the second cylinder may be physically positioned proximate the one or more ground plates.

The loss compensation structure may include a second transmitter, which may include a surface wave launcher. The surface wave launcher may include a third PCB. The third PCB may include a third conductor pin. The third conductor pin may receive the RF signal from the receiver. The third surface wave launcher may also convert the RF signal with the TEM mode to the surface wave with the TM mode. The third PCB may also include one or more ground pads. The surface wave launcher may include a third cylinder. The third cylinder may be electrically coupled to the third conductor pin. The third cylinder may define a third cylinder opening. The third cylinder may receive the RF signal from the third conductor pin. The third cylinder may generate and launch the surface wave. In addition, the surface wave launcher may include a third insulator. The third insulator may be physically positioned within at least a portion of the third cylinder opening and between the third cylinder and the power line extending through the third cylinder opening. The third insulator may mechanically isolate the third cylinder from the power line. The third insulator may permit the third cylinder to launch the surface wave to the power line. Further, the surface wave launcher may include one or more ground plates. The one or more ground plates may be electrically coupled to the one or more ground pads. The one or more ground plates may provide a ground reference for the third conductor pin and the third cylinder. The third conductor pin and the third cylinder may be physically positioned proximate the one or more ground plates.

After the second transmitter of the loss compensation structure, the surface waves may traverse on the power line to destination LAN equipment. There may also be a second surface wave receiver which may include a fourth cylinder. The fourth cylinder may define a fourth cylinder opening. The fourth cylinder may receive the surface wave from the power line. The fourth cylinder may convert the surface wave to a RF signal. The second surface wave receiver may also include a fourth insulator. The fourth insulator may be configured to be physically positioned within at least a portion of the fourth cylinder opening and between the fourth cylinder and the power line extending through the fourth cylinder opening. The fourth insulator may mechanically isolate the fourth cylinder from the power line. The fourth insulator may also permit the fourth cylinder to receive the surface wave from the power line. The second surface wave receiver may include a fourth PCB. The fourth PCB may include a fourth conductor pin. The fourth conductor pin may be electrically coupled to the fourth cylinder. The fourth conductor pin may receive the RF signal wave from the fourth cylinder. The second surface wave receiver may also convert the surface wave with the TM mode to a RF signal with the TEM mode. The fourth PCB may also include one or more ground pads. The second surface wave receiver may include one or more ground plates. The one or more ground plates may be electrically coupled to the one or more ground pads. The one or more ground plates may provide a ground reference for the fourth conductor pin and the fourth cylinder. The fourth conductor pin and the fourth cylinder may be physically positioned proximate the one or more ground plates.

The first surface wave launcher (transmitter) may include a first RF connector. The first RF connector may include a center pin. The center pin may be electrically coupled to the first conductor pin. The first RF connector may also include a ground portion. The ground portion may be electrically coupled to the ground pads. The first RF connector may mechanically couple and electrically couple to a cable to provide the RF signal with the TEM mode from the cable to the launcher.

The loss compensation structure may include the first receiver and the second transmitter. The first receiver may include a second RF connector. The second RF connector may include a second center pin. The second center pin may be electrically coupled to the second conductor pin. The second RF connector may also include a second ground portion. The second ground portion may be electrically coupled to the one or more ground pads. The second RF connector may mechanically couple and electrically couple to a cable to send the RF signal with the TEM mode to the second transmitter through the coaxial cable.

The second surface wave launcher (transmitter) may include a third RF connector. The third RF connector may include a center pin. The center pin may be electrically coupled to the third conductor pin. The third RF connector may also include a ground portion. The ground portion may be electrically connected to the one or more ground pads. The third RF connector may mechanically couple and electrically couple to a cable to provide the RF signal with the TEM mode to the cable.

After the second transmitter of the loss compensation structure, the surface waves may traverse on the power line to destination receiver and LAN equipment. The second receiver may include a fourth RF connector. The fourth RF connector may include a fourth center pin. The fourth center pin may be electrically coupled to the fourth conductor pin. The fourth RF connector may also include a fourth ground portion. The fourth ground portion may be electrically coupled to the one or more ground pads. The fourth RF connector may mechanically couple and electrically couple to a cable to send the RF signal with the TEM mode to the LAN equipment at the destination.

The cable may include a coaxial cable.

The physical change of the power line may include a bend, a break, a joint, a fork, or some combination thereof in the power line.

The loss compensation device may include a first receiver, a second transmitter and an amplifier. The amplifier may be electrically coupled to the first receiver and the second transmitter. The amplifier may compensate for loss due to the receiver converting the surface wave with the TM mode to the RF signal with the TEM mode. In addition, the amplifier may compensate for loss due to the second transmitter converting the RF signal with the TEM mode to the surface wave with the TM mode.

The power line may include a first power line. The loss compensation device may also include a second transmitter. The second transmitter may be physically positioned proximate a second power line. The second transmitter may receive the RF signal from the receiver. The second transmitter may also convert the RF signal to the surface wave. In addition, the second transmitter may launch the surface wave on the second power line.

A method of assembly may include positioning a PCB within an opening defined by a platform device. The PCB may include a conductor pin. The PCB may also include one or more ground pads. The one or more ground plates may be electrically coupled to the one or more ground pads. The one or more ground plates may be mechanically coupled to the PCB. The method may also include positioning a first portion of a cylinder proximate the PCB. The first portion of the cylinder may be physically positioned such that the first portion of the cylinder is electrically coupled to the conductor pin and physically positioned proximate the one or more ground plates. In addition, the method may include positioning a first portion of an insulator proximate the first portion of the cylinder. Further, the method may include positioning the PCB, the first portion of the cylinder, and the first portion of the insulator relative a power line. The PCB, the first portion of the cylinder, and the first portion of the insulator may be physically positioned such that the first portion of the insulator is physically positioned proximate the power line. The method may include positioning a second portion of the insulator proximate the first portion of the insulator and the power line. The method may also include positioning a second portion of the cylinder proximate the second portion of the insulator. The second portion of the cylinder may be physically positioned proximate the second portion of the insulator such that the first portion of the cylinder and the second portion of the cylinder define a cylinder opening. The second portion of the cylinder may be physically positioned proximate the second portion of the insulator such that at least a portion of the first portion of the insulator and the second portion of the insulator are physically positioned within the cylinder opening and the power line extends through the cylinder opening. In addition, the method may include attaching one or more clamps to the platform device. The clamps may be attached such that at least a portion of the first portion of the cylinder, the second portion of the cylinder, the first portion of the insulator, and the second portion insulator are physically positioned between a portion of the one or more clamps and a portion of the platform device.

The one or more clamps may secure the first portion of the insulator between at least a portion of the first portion of the cylinder and a portion of the power line. The one or more clamps may also secure the second portion of the insulator between at least a portion of the second portion of the cylinder and another portion of the power line. In addition, the one or more clamps may cause the second portion of the cylinder to physically contact the first portion of the cylinder such that the second portion of the cylinder is electrically coupled to the first portion of the cylinder. Further, the one or more clamps may maintain a proximity between the first portion of the cylinder and the conductor pin to maintain electrical coupling between the first portion of the cylinder and the conductor pin.

The method may also include mechanically coupling the platform device to a power pole physically positioned proximate the power line.

The first portion of the insulator and the second portion of the insulator, in the assembled state, may be physically positioned proximate the power line, the first portion of the cylinder, and the second portion of the cylinder such that the first portion of the cylinder and the second portion of the cylinder are mechanically isolated from the power line.

The first portion of the insulator and the second portion of the insulator, in the assembled state, may be physically positioned proximate the power line, the first portion of the cylinder, and the second portion of the cylinder such that the first portion of the cylinder and the second portion of the cylinder are electrically isolated from power signals that traverse the power line.

The first portion of the cylinder, in the assembled state, may be physically positioned proximate the PCB such that at least a portion of the first portion of the cylinder is physically positioned between two or more ground plates.

In some aspects, surface wave propagation may be enhanced by adding a couple more flared ground plates perpendicular to the PCB. In this and other aspects, a gap may be formed between the ground plates and the center conductor with the RF connector.

Example 1 may include a surface wave launcher including: a PCB including: a conductor pin configured to receive a RF signal; and a ground pad; a cylinder configured to be electrically coupled to the conductor pin and define a cylinder opening, the cylinder configured to: receive the RF signal from the conductor pin; and form a transition from coplanar to Goubau line structure with s ground plate structure; and generate and propagate the surface wave; an insulator configured to be physically positioned within at least a portion of the cylinder opening and between the cylinder and a portion of a power line, the insulator configured to mechanically isolate the cylinder from the power line and to permit the cylinder to launch the surface wave on the power line; and the ground plate structure electrically coupled to the ground pad and configured to provide a ground reference for the conductor pin and the cylinder, the conductor pin and the cylinder physically positioned proximate the ground plate structure.

Example 2 may include the surface wave launcher of example 1, wherein: the conductor pin is configured to receive the RF signal with a TEM mode; and the cylinder is configured to convert the RF signal to the surface wave with a TM mode after transitioning from coplanar to GL structure formed with cylinder and the ground plate structure.

Example 3 may include the surface wave launcher of any of examples 1 and 2 further including a platform device configured to be mechanically coupled to at least a portion of the PCB.

Example 4 may include the surface wave launcher of example 3, wherein the platform device includes a non-conductive material.

Example 5 may include the surface wave launcher of any of examples 3 and 4, wherein the platform device includes a wood or similar material that includes a dielectric constant similar to air, wherein the platform device is configured to withstand outdoor conditions including rainy weather.

Example 6 may include the surface wave launcher of any of examples 3-5, wherein the platform device includes: a support structure; and a clamp configured to attach to the support structure, the clamp configured to: apply a pressure to the cylinder to secure the insulator between at least a portion of the cylinder and a portion of the power line; and apply a pressure to the cylinder to maintain a proximity between the cylinder and the conductor pin to maintain electrical coupling of the cylinder and the conductor pin.

Example 7 may include the surface wave launcher of any of examples 1-6, wherein the surface wave launcher further includes a SMA connector including: a center pin electrically coupled to the conductor pin; and a ground portion electrically coupled to the ground pad, the SMA connector configured to mechanically and electrically couple to a cable to receive the RF signal.

Example 8 may include the surface wave launcher of any of examples 1-7, wherein the insulator is further configured to electrically isolate the cylinder from power signals that traverse the power line.

Example 9 may include the surface wave launcher of any of examples 1-8, wherein the cylinder is configured to provide the surface wave to the power line via electromagnetic coupling between the cylinder and the power line.

Example 10 may include the surface wave launcher of any of examples 1-9, wherein the ground plate structure is shaped as a flared ground plate that flares in a direction away from the cylinder.

Example 11 may include the surface wave launcher of example 10, wherein the ground plate structure flares in the direction away from the cylinder on a plane that is substantially parallel to a surface of the PCB.

Example 12 may include the surface wave launcher of any of examples 1-10, wherein the ground plate structure includes a first ground plate physically positioned proximate the cylinder on a first side and a second ground plate physically positioned proximate the cylinder on a second side that is opposite the first side.

Example 13 may include the surface wave launcher of example 12, wherein the first ground plate and the second ground plate are physically positioned proximate a first surface of the PCB and the ground plate structure further includes a third ground plate and a fourth ground plate physically positioned proximate a second surface of the PCB, wherein the first ground plate, the second ground plate, the third ground plate, and the fourth ground plate are each soldered to ground pads and are electrically coupled to each other.

Example 14 may include the surface wave launcher of any of examples 12 and 13, wherein the conductor pin is physically positioned proximate the cylinder on a third side on a plane that is orthogonal to a plane of the ground plate structure.

Example 15 may include the surface wave launcher of any of examples 12 and 13, wherein the conductor pin is physically positioned proximate the cylinder on a third side on a plane that is not parallel to a plane of the ground plate structure.

Example 16 may include the surface wave launcher of any of examples 1-15, wherein the ground plate structure forms a three-dimensional ground structure for the surface wave launcher.

Example 17 may include the surface wave launcher of any of examples 1-16, wherein the ground plate structure provides the ground reference for the conductor pin and the cylinder without a ground wire electrically coupled.

Example 18 may include the surface wave launcher of any of examples 1-17, where the insulator includes a material that includes a thickness between two millimeters and twelve millimeters and the thickness of the insulator is based on at least one of a frequency of operation, surface wave launcher dimensions, material properties of the insulator such as a dielectric constant.

Example 19 may include the surface wave launcher of any of examples 1-18, wherein the insulator includes at least one of a porcelain material, a Zirconia material, an Alumina material, an FRP material, and a composite polymer material.

Example 20 may include the surface wave launcher of any of examples 1-18, wherein the insulator includes a ceramic material.

Example 21 may include the surface wave launcher of any of examples 1-20, wherein at least a portion of the PCB includes a PTFE material.

Example 22 may include the surface wave launcher of any of examples 1-21, wherein the surface wave launcher is configured to operate within Wi-Fi frequency bands.

Example 23 may include the surface wave launcher of any of examples 1-22, wherein the surface wave launcher is configured to be positioned within an interior volume defined by an enclosure.

Example 24 a broadband communication system including: a first transmitter configured to be physically positioned proximate a power line, the first transmitter configured to launch a surface wave on the power line; and a loss compensation device configured to be physically positioned proximate a physical change of the power line, the loss compensation device including: a receiver configured to be physically positioned proximate the power line on a first side of the physical change of the power line, the receiver configured to: receive the surface wave via the power line; and convert the surface wave to a RF signal; a second transmitter configured to be physically positioned proximate the power line on a second side of the physical change of the power line, the second transmitter configured to: receive the RF signal from the receiver; convert the RF signal to the surface wave; and launch the surface wave on the power line downstream of the physical change, the loss compensation device configured to bypass the physical change of the power line to compensate for loss due to the physical change of the power line.

Example 25 may include the broadband communication system of example 24, wherein the receiver includes a first receiver and the broadband communication system further includes a second receiver physically positioned proximate destination LAN equipment, the second receiver configured to: receive the surface wave via the power line; and convert the surface wave to another RF signal; and send the another RF signal to the destination LAN equipment.

Example 26 may include the broadband communication system of any of examples 24 and 25, wherein the first transmitter includes a surface wave launcher including: a first PCB including: a first conductor pin configured to receive a TEM mode RF signal with a TEM mode; and a ground pad; a first cylinder configured to be electrically coupled to the first conductor pin and define a first cylinder opening, the first cylinder configured to: form a transition from coplanar to a Goubau line structure with a ground plate structure, convert the TEM mode RF signal to the surface wave with a TM mode; and generate and propagate the surface wave; a first insulator configured to be physically positioned within at least a portion of the first cylinder opening and between the first cylinder and the power line, the first insulator configured to mechanically isolate the first cylinder from the power line and to permit the first cylinder to launch the surface wave on the power line; and the ground plate structure electrically coupled to the ground pad and configured to provide a ground reference for the first conductor pin and the first cylinder, the first conductor pin and the first cylinder physically positioned proximate the ground plate structure.

Example 27 may include the broadband communication system of any of examples 24-26, wherein the receiver includes: a second cylinder defining a second cylinder opening, the second cylinder configured to: receive the surface wave from the power line; and convert the surface wave with the TM mode to another RF signal with the TEM mode; a second insulator configured to be physically positioned within at least a portion of the second cylinder opening and between the second cylinder and the power line, the second insulator configured to mechanically isolate the second cylinder from the power line and to permit the second cylinder to receive the surface wave from the power line; and a second PCB including: a second conductor pin electrically coupled to the second cylinder, the second conductor pin configured to receive the surface wave from the second cylinder; and a ground pad; a ground plate structure electrically coupled to the ground pad and configured to provide a ground reference for the second conductor pin and the second cylinder, the second conductor pin and the second cylinder physically positioned proximate the ground plate structure.

Example 28 may include the broadband communication system of any of examples 24-27, wherein the second transmitter includes a surface wave launcher including: a third PCB including: a third conductor pin configured to receive the RF signal from the receiver; and a ground pad; a third cylinder configured to be electrically coupled to the third conductor pin and define a third cylinder opening, the third cylinder configured to: form a transition from coplanar to Goubau line structure with a ground plate structure; convert the RF signal with the TEM mode to the surface wave with the TM mode; generate and propagate the surface wave; a third insulator configured to be physically positioned within at least a portion of the third cylinder opening and between the third cylinder and the power, the third insulator configured to mechanically isolate the third cylinder from the power line and to permit the third cylinder to provide the surface wave to the power line; and the ground plate structure electrically coupled to the ground pad and configured to provide a ground reference for the third conductor pin and the third cylinder, the third conductor pin and the third cylinder physically positioned proximate the ground plate structure.

Example 29 may include the broadband communication system of any of examples 24-28, further including a second receiver physically positioned proximate destination LAN equipment, the second receiver including: a fourth cylinder defining a fourth cylinder opening, the fourth cylinder configured to: receive the surface wave from the power line; and convert the surface wave with the TM mode to an RF signal with the TEM mode; and send the RF signal to the destination LAN equipment; a fourth insulator configured to be physically positioned within at least a portion of the fourth cylinder opening and between the fourth cylinder and the power line, the fourth insulator configured to mechanically isolate the fourth cylinder from the power line and to permit the fourth cylinder to receive the surface wave from the power line; and a fourth PCB including: a fourth conductor pin electrically coupled to the fourth cylinder, the fourth conductor pin configured to receive the surface wave from the fourth cylinder; and a ground pad; and a ground plate structure electrically coupled to the ground pad and configured to provide a ground reference for the fourth conductor pin and the fourth cylinder, the fourth conductor pin and the fourth cylinder physically positioned proximate the ground plate structure.

Example 30 may include the broadband communication system of any of examples 26-29, wherein the first transmitter includes a first SMA connector including: a center pin electrically coupled to the second conductor pin; and a ground portion electrically coupled to the ground pad, the first SMA connector configured to mechanically and electrically couple to a cable to receive the RF signal with the TEM mode from a source modem via the cable.

Example 31 may include the broadband communication system of any of examples 26-30, wherein the first receiver includes a second SMA connector including: a second center pin electrically coupled to the second conductor pin; and a second ground portion electrically coupled to the ground pad, the second SMA connector configured to mechanically and electrically couple to a cable to send the RF signal with the TEM mode to the second transmitter through the cable.

Example 32 may include the broadband communication system of any of examples 25-31, wherein the second transmitter includes a third SMA connector including: a third center pin electrically connected to the third conductor pin; and a third ground portion electrically connected to the ground pad, the third SMA connector configured to mechanically and electrically couple to a cable to receive the RF signal with the TEM mode from the first receiver through the cable.

Example 33 may include the broadband communication system of any of examples 30-32, wherein the cable includes a coaxial cable.

Example 34 may include the broadband communication system of example 29, wherein the second receiver includes a fourth SMA connector including: a fourth center pin electrically coupled to the fourth conductor pin; and a fourth ground portion electrically coupled to the ground pad, the fourth SMA connector configured to mechanically and electrically couple to a cable to send the RF signal with the TEM mode from the cable to the destination LAN equipment.

Example 35 may include the broadband communication system of any of examples 26-34, wherein the physical change in the power line includes a bend, break, joint, or fork in the power line.

Example 36 may include the broadband communication system of any of examples 26-35, wherein the loss compensation device further includes an amplifier electrically coupled to the first receiver and the second transmitter, the amplifier configured to compensate for loss due to the first receiver converting the surface wave with the TM mode to the RF signal with the TEM mode and the second transmitter converting the RF signal with the TEM mode to the surface wave with the TM mode.

Example 37 may include the broadband communication system of any of examples 26-33, the power line including a first power line and the loss compensation device further including a second transmitter physically positioned proximate a second power line, the second transmitter configured to: receive the RF signal from the first receiver; convert the RF signal to the surface wave; and launch the surface wave on the second power line.

Example 38 may include a method of assembly including: positioning a PCB within an opening defined by a platform device, the PCB including: a ground plate structure; a conductor pin; and a ground pad, wherein the ground plate is electrically coupled to the ground pad and mechanically coupled to the PCB; positioning a first portion of a cylinder proximate the PCB such that the first portion of the cylinder is electrically coupled to the conductor pin and physically positioned proximate the ground plate structure; positioning a first portion of an insulator proximate the first portion of the cylinder; positioning the PCB, the first portion of the cylinder, and the first portion of the insulator relative a power line such that the first portion of the insulator is physically positioned proximate the power line; positioning a second portion of the insulator proximate the first portion of the insulator and the power line; positioning a second portion of the cylinder proximate the second portion of the insulator such that the first portion of the cylinder and the second portion of the cylinder define a cylinder opening, at least a portion of the first portion of the insulator and the second portion of the insulator are positioned within the cylinder opening and the power line extends through the cylinder opening and at least a portion of the insulator extends beyond the cylinder to prevent arcing between the power line and the cylinder; and attaching a clamp to the platform device such that at least a portion of the first portion of the cylinder, the second portion of the cylinder, the first portion of the insulator, and the second portion insulator are physically positioned between a portion of the clamp and a portion of the platform device.

Example 39 may include the method of assembly of example 38, wherein the clamp is configured to: secure the first portion of the insulator between at least a portion of the first portion of the cylinder and a portion of the power line; secure the second portion of the insulator between at least a portion of the second portion of the cylinder and another portion of the power line; cause the second portion of the cylinder to physically contact the first portion of the cylinder such that the second portion of the cylinder is electrically coupled to the first portion of the cylinder; and maintain a proximity between the first portion of the cylinder and the conductor pin to maintain electrical coupling between the first portion of the cylinder and the conductor pin.

Example 40 may include the method of assembly of any of examples 38 and 39 further including attaching solder between the conductor pin and the cylinder, the soldering configured to provide support to the cylinder.

Example 41 may include the method of assembly of any of examples 38-40, the method further including mechanically coupling the platform device to a power pole physically positioned proximate the power line.

Example 42 may include the method of assembly of any of examples 38-41, wherein the first portion of the insulator and the second portion of the insulator are physically positioned proximate the power line, the first portion of the cylinder, and the second portion of the cylinder such that the first portion of the cylinder and the second portion of the cylinder are mechanically isolated from the power line.

Example 43 may include the method of assembly of any of examples 38-42, wherein the first portion of the insulator and the second portion of the insulator are physically positioned proximate the power line, the first portion of the cylinder, and the second portion of the cylinder such that the first portion of the cylinder and the second portion of the cylinder are electrically isolated from power signals that traverse the power line.

Example 44 may include the method of assembly of any of examples 38-43, wherein the first portion of the cylinder is positioned proximate the PCB such that at least a portion of the first portion of the cylinder is physically positioned between two or more ground plates of the ground plate structure.

As used in the present disclosure, terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to aspects containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although aspects of the present disclosure have been described in detail, various changes, substitutions, and alterations could be made hereto without departing from the spirit and scope of the present disclosure.

What is claimed is:

1. A surface wave launcher comprising:
    a printed circuit board (PCB) comprising:
        a conductor pin configured to receive a radio frequency (RF) signal; and
        a ground pad;
    a cylinder configured to be electrically coupled to the conductor pin and define a cylinder opening, the cylinder configured to:
        receive the RF signal from the conductor pin; and
        form a transition from coplanar to Goubau line structure with a ground plate structure; and
        generate and propagate the surface wave;
    an insulator configured to be physically positioned within at least a portion of the cylinder opening and between the cylinder and a portion of a power line, the insulator configured to mechanically isolate the cylinder from the power line and to permit the cylinder to launch the surface wave on the power line; and
    the ground plate structure electrically coupled to the ground pad and configured to provide a ground reference for the conductor pin and the cylinder, the conductor pin and the cylinder physically positioned proximate the ground plate structure.

2. The surface wave launcher of claim 1, wherein:
    the conductor pin is configured to receive the RF signal with a transverse electromagnetic (TEM) mode; and
    the cylinder is configured to convert the RF signal to the surface wave with a transverse magnetic (TM) mode after transitioning from coplanar to GL structure formed with cylinder and the ground plate structure.

3. The surface wave launcher of claim 1 further comprising a platform device configured to be mechanically coupled to at least a portion of the PCB, wherein the platform device comprises:
    a support structure; and
    a clamp configured to attach to the support structure, the clamp configured to:
        apply a pressure to the cylinder to secure the insulator between at least a portion of the cylinder and a portion of the power line; and
        apply a pressure to the cylinder to maintain a proximity between the cylinder and the conductor pin to maintain electrical coupling of the cylinder and the conductor pin.

4. The surface wave launcher of claim 1, wherein the surface wave launcher further comprises a subminiature version A (SMA) connector comprising:
    a center pin electrically coupled to the conductor pin; and
    a ground portion electrically coupled to the ground pad, the SMA connector configured to mechanically and electrically couple to a cable to receive the RF signal.

5. The surface wave launcher of claim 1, wherein the insulator is further configured to electrically isolate the cylinder from power signals that traverse the power line.

6. The surface wave launcher of claim 1, wherein the ground plate structure comprises a first ground plate physically positioned proximate the cylinder on a first side and a second ground plate physically positioned proximate the cylinder on a second side that is opposite the first side.

7. The surface wave launcher of claim 1, wherein the ground plate structure provides the ground reference for the conductor pin and the cylinder without a ground wire electrically coupled.

8. A method of assembly comprising:
    positioning a printed circuit board (PCB) within an opening defined by a platform device, the PCB comprising:
        a ground plate structure;
        a conductor pin; and
        a ground pad, wherein the ground plate structure is electrically coupled to the ground pad and mechanically coupled to the PCB;
    positioning a first portion of a cylinder proximate the PCB such that the first portion of the cylinder is electrically coupled to the conductor pin and physically positioned proximate the ground plate structure;
    positioning a first portion of an insulator proximate the first portion of the cylinder;
    positioning the PCB, the first portion of the cylinder, and the first portion of the insulator relative a power line such that the first portion of the insulator is physically positioned proximate the power line;
    positioning a second portion of the insulator proximate the first portion of the insulator and the power line;
    positioning a second portion of the cylinder proximate the second portion of the insulator such that the first portion of the cylinder and the second portion of the cylinder define a cylinder opening, at least a portion of the first portion of the insulator and the second portion of the insulator are positioned within the cylinder opening and the power line extends through the cylinder opening and at least a portion of the insulator extends beyond the cylinder to prevent arcing between the power line and the cylinder; and
    attaching a clamp to the platform device such that at least a portion of the first portion of the cylinder, the second portion of the cylinder, the first portion of the insulator, and the second portion insulator are physically positioned between a portion of the clamp and a portion of the platform device.

9. The method of assembly of claim 8, wherein the clamp is configured to:
    secure the first portion of the insulator between at least a portion of the first portion of the cylinder and a portion of the power line;
    secure the second portion of the insulator between at least a portion of the second portion of the cylinder and another portion of the power line;
    cause the second portion of the cylinder to physically contact the first portion of the cylinder such that the second portion of the cylinder is electrically coupled to the first portion of the cylinder; and
    maintain a proximity between the first portion of the cylinder and the conductor pin to maintain electrical coupling between the first portion of the cylinder and the conductor pin.

10. The method of assembly of claim 8 further comprising attaching solder between the conductor pin and the cylinder, the soldering configured to provide support to the cylinder.

11. The method of assembly of claim 8, the method further comprising mechanically coupling the platform device to a power pole physically positioned proximate the power line.

12. The method of assembly of claim 8, wherein the first portion of the insulator and the second portion of the insulator are physically positioned proximate the power line, the first portion of the cylinder, and the second portion of the cylinder such that the first portion of the cylinder and the second portion of the cylinder are mechanically isolated from the power line.

13. The method of assembly of claim 8, wherein the first portion of the insulator and the second portion of the insulator are physically positioned proximate the power line, the first portion of the cylinder, and the second portion of the cylinder such that the first portion of the cylinder and the second portion of the cylinder are electrically isolated from power signals that traverse the power line.

14. The method of assembly of claim 8, wherein the first portion of the cylinder is positioned proximate the PCB such that at least a portion of the first portion of the cylinder is physically positioned between two or more ground plates of the ground plate structure.

\* \* \* \* \*